United States Patent
Kang et al.

(10) Patent No.: US 12,211,580 B2
(45) Date of Patent: Jan. 28, 2025

(54) TERMINATION FOR PULSE AMPLITUDE MODULATION

(71) Applicant: Micron Technology, Inc., Boise, ID (US)

(72) Inventors: Shindeok Kang, Boise, ID (US); Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 248 days.

(21) Appl. No.: 17/821,604

(22) Filed: Aug. 23, 2022

(65) Prior Publication Data

US 2023/0075962 A1     Mar. 9, 2023

Related U.S. Application Data

(60) Provisional application No. 63/240,355, filed on Sep. 2, 2021, provisional application No. 63/239,373, filed on Aug. 31, 2021.

(51) Int. Cl.
*G11C 7/10*         (2006.01)
*H03K 7/02*        (2006.01)

(52) U.S. Cl.
CPC ............. *G11C 7/1048* (2013.01); *H03K 7/02* (2013.01); *G11C 2207/2227* (2013.01)

(58) Field of Classification Search
CPC . G11C 7/1048; G11C 2207/2227; H03K 7/02
USPC ........................................................ 365/244
See application file for complete search history.

(56) References Cited

U.S. PATENT DOCUMENTS

| | | |
|---|---|---|
| 2001/0052784 A1 | 12/2001 | Jae-Yoon et al. |
| 2016/0013958 A1 | 1/2016 | Mishra et al. |
| 2022/0200622 A1* | 6/2022 | Woo ..................... G11C 7/1006 |

FOREIGN PATENT DOCUMENTS

| | | |
|---|---|---|
| JP | 2008282499 | 11/2008 |
| KR | 20050064897 | 6/2005 |
| KR | 20060038234 | 5/2006 |

OTHER PUBLICATIONS

"International Search Report and Written Opinion", Application No. PCT/US2022/075412, Dec. 2, 2022, 11 pages.
"International Preliminary Report on Patentability", Application No. PCT/US2022/075412, Mar. 5, 2024, 8 pages.

* cited by examiner

*Primary Examiner* — Huan Hoang
(74) *Attorney, Agent, or Firm* — Colby Nipper PLLC

(57) ABSTRACT

This document describes apparatuses and techniques for termination of a pulse amplitude modulation signal of a memory circuit. In various aspects, a memory circuit is implemented with a termination circuit that includes a power rail, a resistor, and a switch to couple the resistor between the power rail and a signal line of a memory interconnect. The power rail may be configured to provide power at a termination voltage that is nominally half of a voltage of another power rail from which a corresponding transmission circuit operates. This may be effective to enable termination of pulse amplitude modulation signals to the termination voltage instead of a higher voltage that corresponds to the power rail of the transmission circuit or a ground-referenced node. By so doing, use of the termination circuit may reduce power consumption and/or improve signal integrity of the memory circuit.

43 Claims, 12 Drawing Sheets
(1 of 12 Drawing Sheet(s) Filed in Color)

TERMINATION FOR PULSE AMPLITUDE MODULATION

CROSS-REFERENCE TO RELATED APPLICATIONS

This application claims priority to U.S. Provisional Application Ser. No. 63/240,355, filed Sep. 2, 2021, and U.S. Provisional Application Ser. No. 63/239,373, filed Aug. 31, 2021 the disclosures of which are incorporated by reference herein in their entireties.

BACKGROUND

Computers, smartphones, and other electronic devices operate using processors and memories. A processor enables a device to run applications and programs by executing a set of instructions that process data. Generally, the processor obtains the set of instructions and data from a memory that stores this information. Advances in processors have often outpaced those of memory. This outpacing, along with many demands on memory devices, results in processor execution speeds that are often limited by the speed of memories. Further, manufacturers of memories or electronic devices may face demands for faster execution speeds of memories while also enabling power conservation of an electronic device. Accommodating these various demands for memory performance and power conservation results in numerous signal integrity requirements for data signaling to ensure accurate memory operation under increasing demands and power constraints.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Apparatuses of and techniques for termination of a pulse amplitude modulation signal of a memory circuit are described with reference to the following drawings. The same numbers are used throughout the drawings to reference like features and components.

DETAILED DESCRIPTION

Overview

Figure 1:
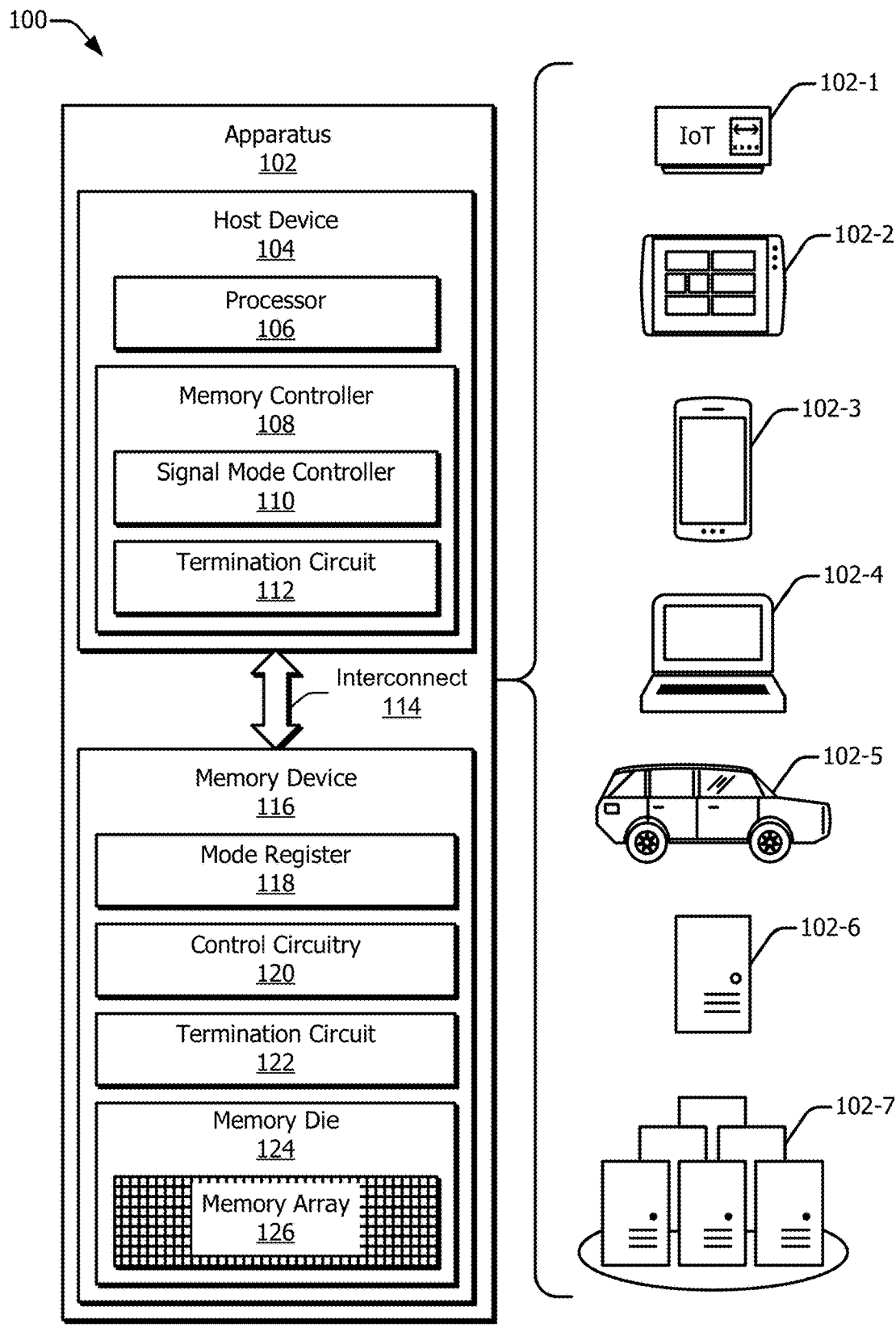
FIG. 1 illustrates an apparatus in which aspects of termination for pulse amplitude modulation can be implemented for a memory system.

Computers, smartphones, and other electronic devices operate using processors and memories to run a variety of programs and applications, ranging from low-power operating systems and background utilities to computationally intensive applications for high-resolution graphics, computational simulations, artificial intelligence (AI), and so forth. Execution speeds associated with these programs and applications are often related to the performance of a memory of the device, which is contingent, in part, on a frequency of clock signals used to enable and coordinate operation of the memory.

By way of review, a memory device operates based on clock and input/output (I/O) signals by which data is transferred between a memory controller and the memory device. To increase data transfer rates or bandwidth to improve system performance or capability, the memory controller can increase I/O speed of the memory device. Increasing I/O speed of the memory device, however, consumes additional power, which can be an important factor for run times or battery life of mobile devices. As an alternative to increasing I/O speed, some systems may implement pulse amplitude modulation (PAM) signaling, which can transmit multiple data bits over a signal line (e.g., data line) in a single clock cycle. Thus, PAM signaling may enable an increased I/O bandwidth at a lower I/O speed than non-return-to-zero (NRZ) signaling. To implement PAM signaling, however, voltage of power supplies for respective circuits in the memory device and memory controller is increased to ensure proper eye height for multi-level signal, which also increases power consumption of the memory system. For example, parallel pull-up resistors or parallel pull-down resistors can be connected to an I/O power supply or ground reference in a memory device to implement center termination. This results in a shunt current path between the power supply and ground reference that can consume more power when using PAM signaling than NRZ signaling. As such, preceding techniques using the I/O power supply and ground reference for center termination fail to address power consumption or other issues associated with the use of PAM signaling.

To address these and other issues associated with PAM signaling in memory circuits, this document describes aspects of termination for pulse amplitude modulation. Various aspects, example circuits, memory devices, memory controllers, and methods are described herein for terminating signals received by a memory circuit with a termination circuit that includes a switch and a resistor to a power rail. In various aspects, a memory circuit is implemented with a termination circuit for PAM signaling or other receive modes that includes a power rail, a resistor, and a switch to couple the resistor between the power rail and a data line of a memory interconnect. The power rail may be configured to provide power at a termination voltage that is nominally half of a voltage of another power rail from which a corresponding transmission circuit operates. This may be effective to enable termination of pulse amplitude modulation signals to the termination voltage instead of a higher voltage that corresponds to the power rail of the transmission circuit or a ground-referenced node. By so doing, use of the termination circuit may reduce power consumption and/or improve signal integrity of the memory circuit. Additional features provided by aspects of termination for PAM may include less duty cycle distortion, improved pre-emphasis, or simplified calibration procedures.

Generally, in order to reduce power consumption of a memory system, such as a mobile dynamic random-access memory (DRAM), voltage of an output stage power supply for data I/O pins (e.g., VDDQ) with NZR signaling is lower than a core voltage (e.g., VDD2H) of a memory device or memory controller. For multi-level signaling schemes, such as pulse-amplitude modulation (PAM), the output stage power supply voltage is increased (e.g., doubling from 0.5V to 1.0V) to provide adequate signal eye height margin for the multiple signal levels. Expectedly, increasing the voltage of the output stage power supply of the I/O pins and corresponding supply voltage of receive-side circuitry increases power consumption of the memory system.

In aspects of termination for pulse amplitude modulation, a termination circuit may include a power rail configured to provide power at a voltage that is less than a voltage of the I/O or DQ line drive circuit (e.g., VDDQ) or receive circuit (e.g., VDD2H) power supplies. For example, the termination circuit may include a switch, a pull-up resistor, and additional switch drive and control circuitry to couple the resistor to a data line of a memory interconnect to provide a termination for PAM signaling. For example, when a memory circuit provides DQ line drive power for PAM signaling with a higher-voltage core power supply (e.g., VDD2H, 1.0V), the termination circuit may use the lower-voltage DQ line drive power supply (e.g., VDDQ, 0.5V) as a termination voltage (Vtt) to which the DQ line is coupled via the resistor of the termination circuit. As described herein, despite using the higher-voltage power supply (e.g., VDD2H) for DQ line drivers, power consumption of the memory system can be reduced by using the lower-voltage power supply (e.g., Vtt, 0.5V) for termination of the PAM signals. Additionally, terminating the PAM signals to this mid-level voltage (e.g., Vtt, 0.5V) may enable increased efficiency of an equalizer of the memory system transceiver circuits, reduce duty cycle distortion typically associated with full-level line drive voltage or ground-based termination, or enable simplified ZQ line calibration that addresses linearity issues of some transmit circuits. These are but a few examples of termination for pulse amplitude modulation, others of which are described throughout this disclosure.

Example Operating Environments

FIG. 1 illustrates at 100 an apparatus 102 in which aspects of termination for pulse amplitude modulation for memory circuits can be implemented. The apparatus 102 can include, for example, an internet-of-things (IoT) device 102-1, tablet device 102-2, smartphone 102-3, notebook computer 102-4, an automobile 102-5, server computer 102-6, server cluster 102-7 that may be part of cloud computing infrastructure or a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), a graphics processor unit (GPU) card, desktop computer, motherboard, server blade, consumer appliance, public transportation device, drone, industrial equipment, security device, sensor, or an electronic component thereof. These example apparatus configurations can include one or more components to provide various computing functionalities, data processing, and/or features.

In the example implementations shown at 100, the apparatus 102 may include a host device 104 with at least one processor 106 and at least one memory controller 108. The apparatus 102 can be implemented in various manners with more, fewer, or different components. For example, the host device 104 may include multiple cache memories (e.g., including multiple levels of cache memory) associated with the processor 106 and/or the memory controller 108 or no cache memory. In other implementations, the host device 104 may omit the processor 106 or the memory controller 108. In addition to one or more cache memories, the host device 104 can include additional components to form a system-on-a-chip (SoC).

The processor 106 may be implemented as any suitable type of processor, which may include a general-purpose processor, one or more processing cores, a central processing unit (CPU), a graphics processing unit (GPU), a neural network engine or accelerator, an application-specific integrated circuit (ASIC), a field-programmable gate array (FPGA) integrated circuit (IC), a communications processor (e.g., a modem or baseband processor), or the like. In operation, the memory controller 108 can provide a high-level or logical interface between the processor 106 and at least one memory (e.g., a memory array or external memory) that is coupled to the host device 104 using a respective interconnect. The memory controller 108 can, for example, receive memory requests from the processor 106 and provide the memory requests to a memory array with appropriate formatting, timing, and reordering in accordance with a memory access protocol or specification (e.g., protocols of a Low-Power Double Data Rate 5 (LPDDR5) or Low-Power Double Data Rate 6 (LPDDR6)). The memory controller 108 can also forward or return memory responses received from the memory array to the processor 106.

The memory controller 108 depicted in 100 includes signal mode controller 110 and a termination circuit 112. A memory interconnect 114 operably couples the host device 104 (e.g., via host interface) or the memory controller 108 to a memory device 116 (e.g., via an interface to the interconnect). In aspects, the signal mode controller 110 controls operating parameters of signal lines (e.g., data lines, clock lines, strobe lines, etc.) of the interconnect 114 by which the memory controller 108 and memory device 116 coordinate and execute transfers of data or other information. For example, the signal mode controller 110 may configure the memory controller 108 and the memory device 116 to operate in a non-return-to-zero (NRZ) mode or a pulse amplitude modulation (PAM) mode for executing data transfers over the interconnect 114. Alternatively or additionally, the signal mode controller 110 can configure respective clock circuits (e.g., frequencies), transmit circuits, receive circuits, and/or termination circuits (e.g., on-die terminations (ODTs)) of the interconnect signal lines.

In aspects, the signal mode controller 110 configures, via control circuitry (not shown), the termination circuit 112 and/or ODTs of the memory controller 108 to provide various termination configurations (e.g., impedance and/or voltage) for the signal lines of the interconnect 114 to support various signaling modes and/or interconnect configurations. For example, the processor 106 may implement a memory performance utility that provides an indication to the memory controller 108 for a desired or target level of memory performance. The memory controller 108 may use this or other information provided by the processor 106 to configure, via the signal mode controller 110, a signaling mode, operating frequency, termination setting, and/or operating voltages of the memory device 116. In some cases, the memory controller 108 includes a memory performance monitor (not shown) that uses memory performance metrics or memory access information to characterize or profile memory access performance. Based on the memory access performance or memory power consumption, the memory monitor can determine an operating configuration for the memory device 116, which may include a signaling mode, operating frequency, termination setting, or operating voltage by which to operate the memory device 116. For example, the memory performance monitor can profile the memory access performance or power consumption associated with the memory device 116 and compare the memory access performance or power consumption with a respective performance threshold (e.g., minimum or maximum threshold) of an operating configuration (e.g., signaling mode, frequency, and voltage) of the memory device 116. The memory performance monitor may then select another operating configuration (associated with higher performance or lower performance) of the memory device 116 to align performance (e.g., bandwidth, latency, power consumption) of the memory device 116 with the profiled memory access performance and use the signal mode controller 110 to reconfigure the memory device 116 and termination circuit 112 based on the selected configuration.

The memory device 116, which is coupled to the host device 104 using the interconnect 114, can be implemented as any suitable type of memory module, memory die, memory array, memory circuit, or the like. Examples of the memory device 116 include a DRAM package or module (e.g., an LPDDR synchronous DRAM (SDRAM)). The DRAM package or module can include a three-dimensional (3D) stacked DRAM device, a high-bandwidth memory (HBM) device, or a hybrid memory cube (HMC) device. In general, there are multiple types of DRAM. As one example, a low-power double data rate (DDR) memory, also referred to as LPDDR or mobile DDR, is a DDR SDRAM. LPDDR generally uses less power than other types of DDR SDRAM. In some applications, an SDRAM memory, an LPDDR memory, or other memory may be configurable to operate using different combinations of signaling mode, operating frequency, and operating voltage for scalable performance to support applications or memory access profiles that range from low-power, moderate, or memory intensive.

As shown in 100, the memory device 116 may include or be implemented with a mode register 118 (or a registered clock driver (RCD)), control circuitry 120, termination circuit 122, and one or more memory dies 124 that include a respective memory array 126. In some cases, the memory array 126 includes memory cells organized into one or more memory banks. While the signal mode controller 110 is depicted in 100 as part of the host device 104, in general, this entity (or a portion thereof) can be implemented as a component of the apparatus 102, the memory device 116, or mode register 118 of the memory device 116. Generally, the memory device 116 can also perform operations to, for example, communicate with the memory controller 108 and perform memory read or write operations using various components of the mode register 118, control circuitry 120, and/or memory die 124.

The mode register 118 of the memory device 116 may receive commands from the memory controller 108 to control or configure various operating parameters of the memory device 116 or memory dies 124. For example, the mode register 118 may use the control circuitry 120 to configure clock settings, power settings, termination settings, or the like for one or more memory dies 124 of the memory device 116. Though not depicted in FIG. 1, the control circuitry 120 of the memory device 116 can include, for example, one or more registers, array control logic, clock circuitry, write-path circuitry, read path circuitry, and so forth. The control circuitry 120 can also synchronize various memory components with one or more clock signals received from the memory controller 108, including a clock (CK) signal (e.g., a true CK (CK_t) or a complementary CK (CK_c)) or a write clock (WCK) signal (e.g., WCK_t or WCK_c). The control circuitry 120 can additionally use an internal clock signal to synchronize memory components. The CK and/or WCK signals can be used to set a transfer rate of a command and address (CA) signal and a rate at which data (DQ) and data strobes (DQS) are transferred between a host device and the memory die 124. The control circuitry 120 can additionally use an internal clock signal to synchronize memory components. Alternatively or additionally, the control circuitry 120 of the memory device 116 can generate read data strobe (RDQS) signals to provide a clock signal to internal logic of the memory controller 108 for receiving and decoding data responses received from the memory device 116 over a data (e.g., DQ) bus of the interconnect.

In aspects, the termination circuit 122 of the memory device 116 includes resistive elements and respective switches to provide termination configurations (e.g., impedance and/or voltage) for signal lines of the interconnect 114 to support various signaling modes and/or interconnect configurations. For example, the termination circuit may include a pull-up resistor to a power rail that provides power at a lower voltage (e.g., termination voltage, Vtt) than a DQ line drive voltage (VDDQ) of a transmit circuit configured for PAM signaling. By so doing, the termination circuit 122 may reduce power consumption of the memory device 116 when operating in the PAM signaling mode or other receive modes. These and other capabilities of the termination circuits 112, 122 may be used to implement aspects of termination for pulse amplitude modulation, examples of which are described herein.

The memory array 126 of the memory die 124 can include any suitable type or configuration of a memory circuit or memory cells, including but not limited to memory cells of DRAM, SDRAM, 3D-stacked DRAM, DDR memory, LPDRAM, or LPDDR SDRAM. For example, the memory array 126 can include memory cells of SDRAM configured as a memory module with one channel containing either 16 or 8 DQ signals, double-data-rate input/output (I/O) signaling, and support for a supply voltage. The density of the memory die 124 or memory array 126 can range, for instance, from 2 gigabits (Gb) to 32 Gb. The memory die 124, memory array 126, and the control circuitry 120 may be components of a single semiconductor die or separate semiconductor dies. In some cases, the memory array 126 or the control circuitry 120 are distributed across multiple memory dies 124 of the memory device 116.

The host device 104 can be operatively coupled, using the interconnect 114 of the apparatus 102, to a cache memory (not shown), which may be operatively coupled to the memory device 116. As shown in this example, the memory device 116 is connected to the host device 104 using the interconnect 114 without an intervening buffer or cache. The memory device 116 may also operatively couple to a storage memory (not shown) of the apparatus 102. The storage memory can include, for example, a storage-class memory device (e.g., a flash memory, hard disk drive, solid-state drive, phase-change memory (PCM), or memory employing 3D XPoint™). The host device 104 can be coupled, directly or indirectly, using the interconnect 114, to the memory device 116 and a storage memory. This interconnect 114 can transfer data between two or more components of the apparatus 102. Examples of the interconnects include a bus, switching fabric, and one or more signal lines that carry voltage or current signals. Though not illustrated, the interconnect 114 can include at least one command/address (CA) bus and at least one data (DQ) bus. Each bus may be a unidirectional or a bidirectional bus. In some implementations, an interconnect 114 may also include a chip-select (CS) I/O that can, for example, couple to one or more CS pins of the memory device 116. An interconnect 114 may also include a CK bus that is part of or separate from the CA bus.

Alternatively or additionally, the memory device 116 may have an "internal" or "local" cache memory for storing or buffering data for read and/or write operations. In some cases, the host device 104 and the memory device 116 can be disposed on, or physically supported by, a PCB (e.g., a rigid or flexible motherboard). The host device 104 and the memory device 116 may additionally be integrated on an IC or fabricated on separate ICs packaged together. The memory device 116 may also be coupled to multiple host devices 104 using one or more interconnects and may respond to memory requests from two or more host devices 104. Each host device 104 may include a respective memory controller 108, or the multiple host devices 104 may share a memory controller 108.

Figure 2:
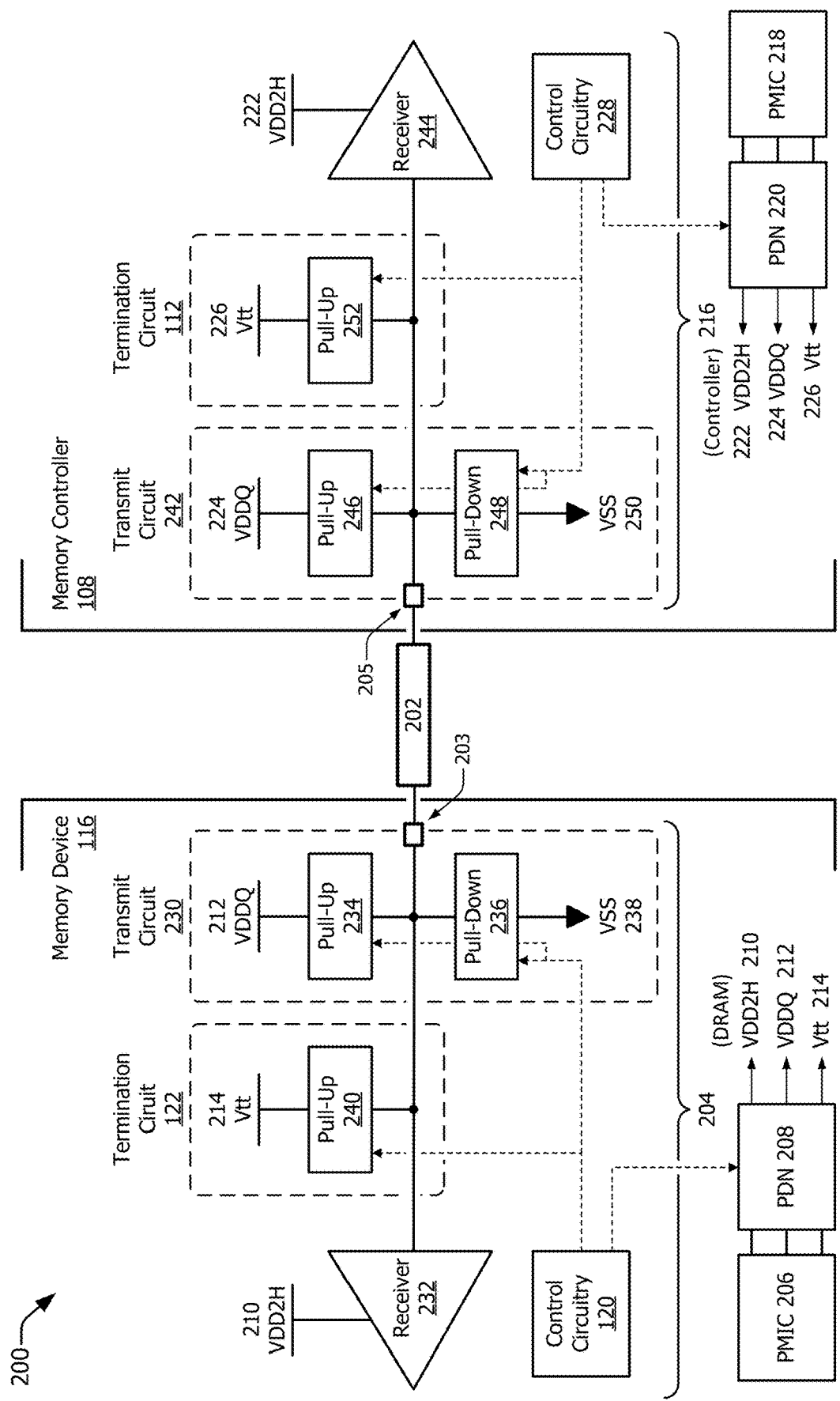
FIG. 2 illustrates an example configuration of a termination circuit that can be implemented in a host device, memory controller, or memory device in accordance with one or more aspects.

FIG. 2 illustrates at 200 an example configuration of a termination circuit that can be implemented in a host device, memory controller, or memory device in accordance with one or more aspects. In this example configuration, a memory device 116 is coupled to a memory controller 108 by a data line 202 of a memory interconnect (e.g., interconnect 114) that extends between respective DQ terminals (e.g., pins or pads) of the memory controller 108 and the memory device 116. The memory device 116 includes a transceiver circuit 204, a power management integrated-circuit 206 (PMIC 206), and a power distribution network 208 (PDN 208) that distributes or routes power provided by the PMIC 206 to components of the memory device, including components of the transceiver circuit 204. In some cases, the memory device 116 and/or memory controller 108 include a respective electrostatic discharge protection element 203, 205 (e.g., transient voltage suppression (TVS) diode) on the data line 202 or other signal/power lines that terminate to circuitry of the device or controller. Alternatively or additionally, the memory device 116 may provide power rails (or voltage rails) described herein using any suitable combination of multiple power supplies, an adjustable power supply, load switches, linear power supplies, switching power supplies, and so forth.

In aspects, the PMIC 206 supplies power for circuitry of the memory device 116 at multiple levels, which are distributed by the PDN 208 to respective power rails of the memory device 116. For example, the PMIC 206 may supply power at first and second core voltages (e.g., VDD2L, VDD2H) to support core voltage scaling and an I/O voltage (e.g., VDDQ) to support I/O operation. In some cases, the voltage of the I/O power supply (e.g., VDDQ, 0.5V) is nominally one half the first voltage (e.g., VDD2L, 0.90V) and/or the second voltage (VDD2H, 1.0V) of the core supplies. The mode register 118 and/or signal mode controller 110 (via the mode register) may control the generation and distribution of power to the power rails for the memory device 116 through the control circuitry 120 or another power control interface (not shown).

In aspects for termination of pulse amplitude modulation, the PDN 208 may route a higher voltage core power rail (e.g., VDD2H, 1.0V) to a DQ line voltage power rail (e.g., VDDQ) when the memory device 116 is configured to operate in a multi-level signaling mode, which may include a three-level PAM (PAM3) mode or a four-level PAM (PAM4) mode. To provide a termination voltage (e.g., Vtt) for the termination circuit 122, the PDN 208 can route a lower voltage (e.g., I/O power supply, 0.5V) to a termination power rail. As shown in FIG. 2, the power rails provided by the PDN 208 to the transceiver of the memory device include a core power rail 210 (VDD2H 210), a DQ line power rail 212 (VDDQ 212), and a termination power rail 214 (Vtt 214), each of which may be selectively configurable by the control circuitry 120 of the memory device.

Circuitry of the memory controller 108 may be configured similar to or different from the circuitry of the memory device 116. In this example, the memory controller 108 includes a transceiver circuit 216 coupled to the data line 202, a PMIC 218, and a PDN 220 that distributes or routes power provided by the PMIC 218 to components of the memory controller, including components of the transceiver circuit 216. Alternatively or additionally, the memory controller 108 may provide power rails (or corresponding voltage rails) described herein using any suitable combination of multiple power supplies, an adjustable power supply, load switches, linear power supplies, switching power supplies, and so forth.

In aspects, the PMIC 218 supplies power for circuitry of the memory controller 108 at multiple levels, which are distributed by the PDN 220 to respective power rails of the memory controller 108. For example, the PMIC 218 may supply power at first and second core voltages (e.g., VDD2L, VDD2H) to support core voltage scaling and an I/O voltage (e.g., VDDQ) to support I/O operation. In some cases, the voltage of the I/O power supply (e.g., VDDQ, 0.5V) is nominally one half the first voltage (e.g., VDD2L, 0.95V) and/or the second voltage (VDD2H, 1.05V) of the memory controller core supplies. The signal mode controller 110 may control the generation and distribution of the power rails for the memory controller through the control circuitry 228 or another power control interface (not shown).

In aspects for termination of pulse amplitude modulation, the PDN 220 may route a higher voltage core power rail (e.g., VDD2H, 1.05V) to a DQ line voltage power rail (e.g., VDDQ) when the memory controller 108 is configured to operate in a multi-level signaling mode, which may include a PAM3 mode or a PAM4 mode. To provide a termination voltage (e.g., Vtt) for the termination circuit 112 of the memory controller, the PDN 220 can route a lower voltage (e.g., I/O power supply, 0.5V) to a termination power rail. As shown in FIG. 2, the power rails provided by the PDN 220 to the transceiver of the memory controller include a core power rail 222 (VDD2H 222, e.g., 1.0V), a DQ line power rail 224 (VDDQ 224), and a termination power rail 226 (Vtt 226), each of which may be selectively configurable by the control circuitry 228 of the memory device.

In aspects, a termination power rail 214 or 226 may be configured to provide the power at a voltage that is less than two thirds of a voltage of the VDDQ or VDD2H power rails. For example, as described with reference to FIG. 3, the termination power rail 214 or 226 can be configured provide a termination voltage that is nominally one half of the voltage at which the VDDQ or VDD2H power rails operate. Thus, the DQ line drivers or amplifiers of a memory circuit may operate at a voltage that is nominally twice the termination voltage. As described herein, resistance values or voltage values may be selected or configured relative to another value within an approximate range, which may include a tolerance range of ten to fifteen percent (e.g., 0.5V being within a tolerance range of ten percent of one half of VDDQ, one half of VDD2H, and/or one half of VDD2L).

By way of example, consider a memory implemented in a low-power or mobile device, such as an LPDDR5 DRAM. In an NRZ signaling mode, the memory may use a low voltage VDDQ power rail (e.g., 0.5V) and VSS termination to reduce I/O power consumption associated with memory access operations. The memory controller and memory device use a higher voltage VDD2H (1.05V) for respective peripheral circuit and core circuit operation. In accordance with aspects of termination for PAM signaling, when the memory controller and memory device operate in the PAM signaling mode, the previous low voltage VDDQ (0.5V) is used for the termination voltage (Vtt) and the power distribution network supplies VDD2H (1.0V) as VDDQ power for I/O signaling to provide headroom for multi-level signaling. Thus, the lower voltage power rail can be repurposed as the termination voltage Vtt for PAM signaling, and power consumption can be reduced as described herein. Additionally, because an existing power supply can be used for the termination voltage Vtt and the VDDQ power supply uses the same VDD2H voltage as the core circuitry, aspects of termination for PAM signaling can be implemented without increasing a number of power supplies in the memory device or the memory controller. In some cases, the addition pull-up drive may increase capacitance on a signal line; however, PAM signaling typically operates at a lower frequency than NRZ signaling at a same or increased bandwidth, which may obviate this issue. Generally, implementing termination for PAM with the termination voltage Vtt reduces power consumption over an NRZ signaling mode, and as data rates increase, the increased bandwidth and lower power consumption of PAM signaling with Vtt termination can become more advantageous.

Returning to the transceiver circuit 204 of the memory device 116, an example transceiver configuration is illustrated with a transmit circuit 230, termination circuit 122, and a receiver amplifier 232 (receiver 232). Although not shown, an output of the receiver 232 (e.g., input buffer or gain amplifier) may be coupled to an equalizer, a decision feedback equalization (DFE) circuit, or de-serializer to receive DQ signals for data write operations to the memory device 116. In aspects, the receiver 232 operates from the VDD2H power rail 210 (e.g., 1.0V) or core voltage of the memory device and has an input that is coupled to the data line 202 to receive the DQ signals over the interconnect between the memory device 116 and the memory controller 108. The transmit circuit 230 includes a pull-up element 234 coupled between the data line 202 and VDDQ power rail 212 and a pull-down element 236 coupled between the data line 202 and a ground reference 238 (VSS 238). In some cases, a pull-up element 234 (or 246) is implemented with a PMOS switch transistor, such as to establish sufficient VGs voltage. Alternatively, the pull-down element 236 or other pull-down elements or resistors described herein may be coupled to a node referenced to ground or a node configured to sink current to enable functionality of the pull-down element 236.

The pull-up element 234 may include one or more resistors and respective switches to apply a pull-up impedance to the data line 202. For example, the pull-up element 234 may include two resistors in parallel (e.g., an 80∥80Ω configuration or a 60∥120Ω configuration) with respective switch elements coupled between the data line and the VDDQ power rail 212. Alternatively or additionally, the pull-down element 236 may include two resistors in parallel (e.g., an 80∥80Ω configuration or 60∥120Ω configuration) with respective switch elements coupled between the data line and the VSS reference 238. With respect to specific configurations of the pull-up elements or pull-down elements described herein, a resistive element may be coupled directly to the data line 202 or the reference voltage (VDD or VSS), with a switch element coupled to an unconnected terminal of the resistive element and the other of the data line 202 or the reference voltage to which the resistive element is not coupled. As described with reference to FIGS. 4A and/or 4B, the control circuitry 120 may use the pull-up element 234 and/or the pull-down element 236 of the transmit circuit 230 to implement PAM signaling of data to the memory controller 108. As shown or described herein, pull element resistance (e.g., nominal or rated value) may include a sum of passive resistance of the pull element in addition to resistance of a switch transistor (e.g., NMOS or PMOS switch).

In aspects of termination for pulse amplitude modulation, a termination circuit 122 of the transceiver circuit 204 includes a pull-up element 240 to the termination power rail 214. To implement a termination for PAM signaling modes, pull-up element 240 of the termination circuit may include a resistor, a switch element, and a switch driver or control line from the control circuitry 120. In some cases, the components and circuitry of the termination circuit enable selective activation of the termination circuit for PAM signaling independent of other pull-up elements or pull-down elements of transmit and/or receive circuits of the transceiver circuit 204 of the memory device. As described herein, the PDN 208 may also provide power to the termination power rail Vtt 214 at a lower voltage (e.g., 0.5V), which reduces power consumption of the transceiver circuit 204 with the termination circuit 122 active when the memory device 116 operates in a PAM signaling mode.

In aspects, the transceiver circuit 216 of the memory controller 108, may be implemented similar to or different from the receiver circuit 204 of the memory device 116. In the example transceiver configuration of the memory controller 108, the transceiver circuit 216 includes a transmit circuit 242, termination circuit 112, and a receiver amplifier 244 (receiver 244). Although not shown, an output of the receiver 244 (e.g., input buffer or gain amplifier) may be coupled to an equalizer, a decision feedback equalization (DFE) circuit, or de-serializer to receive DQ signals for data read operations from the memory device 116. In aspects, the receiver 244 operates from the VDD2H power rail 222 (e.g., 1.0V) or core voltage of the memory controller and has an input that is coupled to the data line 202 to receive the DQ signals over the interconnect between the memory device 116 and the memory controller 108. The transmit circuit 242 includes a pull-up element 246 coupled between the data line 202 and VDDQ power rail 224 and a pull-down element 248 coupled between the data line 202 and a ground reference 250 (VSS 250). Alternatively, the pull-down element 248 or other pull-down elements or resistors described herein may be coupled to a node referenced to ground or a node configured to sink current to enable functionality of the pull-down element 248.

The pull-up element 246 may include one or more resistors and respective switches to apply a pull-up impedance to the data line 202. For example, the pull-up element 246 may include two resistors in parallel (e.g., an 80∥80Ω configuration) with respective switch elements (e.g., series switches) coupled between the data line and the VDDQ power rail 224. Alternatively or additionally, the pull-down element 248 may include two resistors in parallel (e.g., an 80∥80Ω configuration) with respective switch elements (e.g., series switches) coupled between the data line and the VSS reference 250. As described with reference to FIG. 4A and/or 4B, the control circuitry 120 may use the pull-up element 246 and/or the pull-down element 248 of the transmit circuit 242 to implement PAM signaling of data to the memory device 116.

In aspects of termination for pulse amplitude modulation, a termination circuit 112 of the transceiver circuit 216 includes a pull-up element 252 to the termination power rail 226. To implement a termination for PAM signaling modes, pull-up element 252 of the termination circuit may include a resistor, a switch element, and a switch driver or control line from the control circuitry 228. In some cases, the components and circuitry of the termination circuit enable selective activation of the termination circuit for PAM signaling independent of other pull-up elements or pull-down elements of transmit and/or receive circuits of the transceiver circuit 216 of the memory controller. As described herein, the PDN 220 may also provide power to the termination power rail Vtt 226 at a lower voltage (e.g., 0.5V), which reduces power consumption of the transceiver circuit 216 with the termination circuit 112 active when the memory controller 108 operates in a PAM signaling mode.

Figure 3:
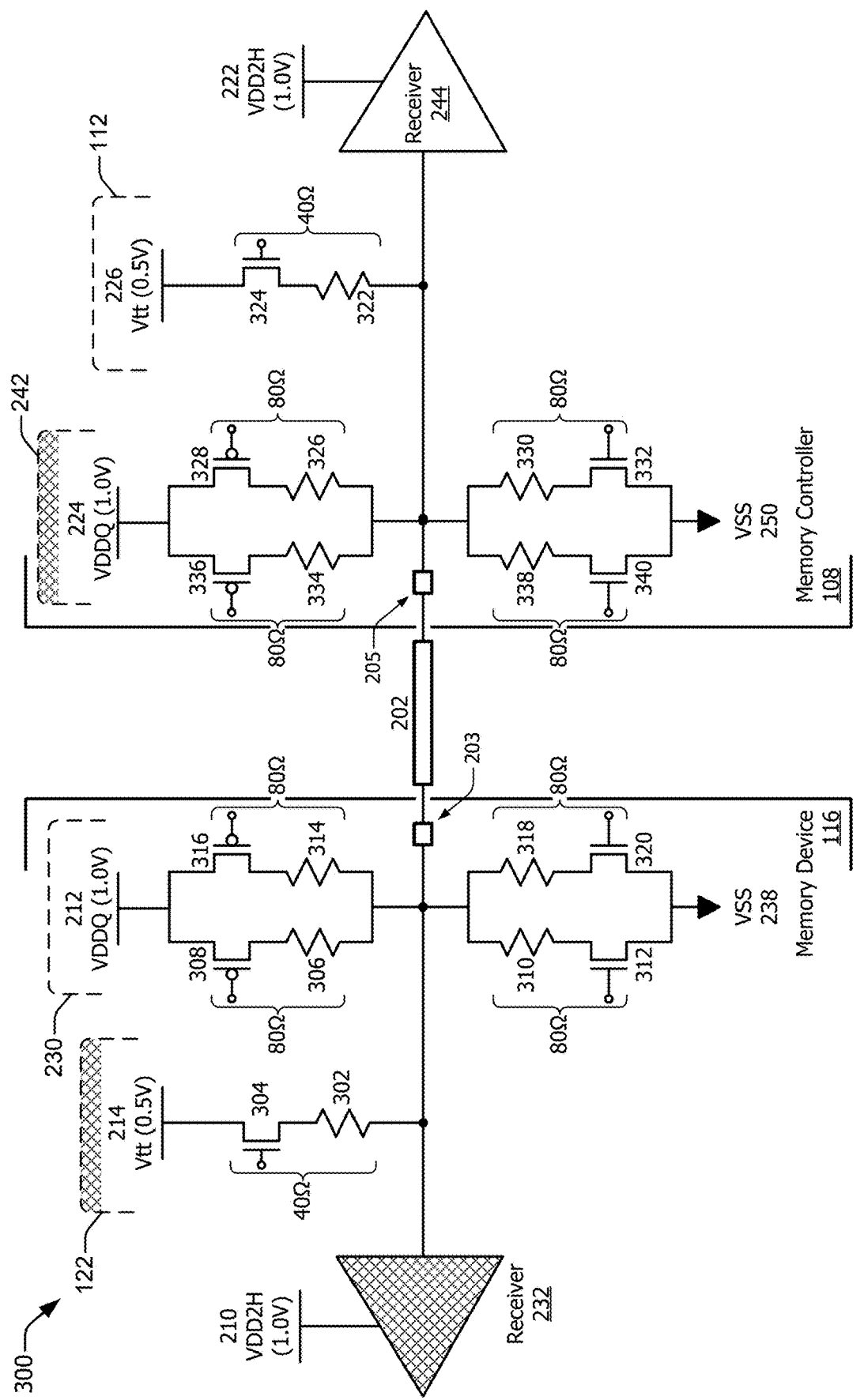
FIG. 3 illustrates an example configuration of a termination circuit for pulse amplitude modulation in accordance with one or more aspects.

FIG. 3 illustrates at 300 an example configuration of a termination circuit for pulse amplitude modulation in accordance with one or more aspects. Although shown in the context of the components and voltages of FIG. 2, the indicated resistor values and voltages are non-limiting examples that may be used to implement aspects of termination for PAM signaling. As such, the aspects described herein may be implemented with any suitable respective pull-up element, pull-down element, and/or voltage configurations for termination of PAM signaling. Additionally, the example configuration at 300 is described with reference to a read operation (e.g., transmission by the memory device to the memory controller), with the described aspects also being applicable for write operations by the memory controller (e.g., transmission by the memory controller to the memory device).

In aspects, the memory controller 108 may use a termination circuit 112 when receiving DQ signals from the memory device 116 via the data line 202. In the context of FIG. 3, the mode register 118 of the memory device 116 may disable (greyed-out components) the receiver 232 and termination circuit 122 of the memory device as part of a receive mode, leaving the transmit circuit 230 enabled. The signal mode controller 110 of the memory device 116 may disable (greyed-out components) the transmit circuit 242 of the memory controller as part of a receive mode, leaving the receiver 244 and termination circuit 112 enabled.

With reference to the example configuration of the memory device 116, the termination circuit 122 includes a first resistor 302 coupled to the data line 202 and a first switch 304 coupled between the first resistor 302 and the termination power rail 214 (e.g., a 40Ω pull-up to Vtt). In some cases, the first switch is implemented as an NMOS switch with a gate/control voltage based on VDDH2, which may ensure sufficient $V_{GS}$ voltage for pull-up operation. The transmit circuit 230 includes, as part of a pull-up element, a second resistor 306 coupled to the data line 202 and a second switch 308 coupled to between the second resistor 306 and the VDDQ power rail 212 (e.g., an 80Ω pull-up to VDDQ). A pull-down element of the transmit circuit 230 includes a third resistor 310 coupled to the data line 202 and a third switch 312 coupled between the third resistor 310 and the ground reference 238 (e.g., an 80Ω pull-down to VSS). As shown by the indicated resistor values, the respective resistances of the pull-up and pull-down elements of the transmit circuit 230 may be balanced or matched, which may include same or similar resistance values within a ten percent tolerance range. In aspects, the individual resistances (80Ω, nominal or rated) of the pull-up and pull-down elements of the transmit circuit 230 may have a resistance value of twice the resistance of the pull-up element of the termination circuit 122. In other words, the resistance of the pull-up of the termination circuit may have a resistance value that is nominally one half the resistance value of the respective resistances of the pull-up and pull-down elements of the transmit circuit 230. As described herein, resistance values or voltage values may be selected or configured relative to another value within an approximate range, which may include a tolerance range of ten to fifteen percent (e.g., pull-up 240 being 34Ω relative pull-up element 234 or pull-down element 236 being 80Ω and so forth).

As shown in FIG. 3, the pull-up and pull-down elements of the transmit circuit may be implemented as parallel elements, or in this example, a parallel 80Ω configuration (80∥80Ω) or 60∥120Ω configuration. Alternatively, the transmit circuit 230 and/or transmit circuit 242 may be implemented with single pull-up and pull-down elements with resistance values nominally equivalent to the combined parallel value or the resistance value of the termination resistor (e.g., 302, 322). When implemented with parallel pull elements, the transmit circuit 230 may include a fourth resistor 314 coupled to the data line 202 and a fourth switch 316 coupled between the fourth resistor 314 and the VDDQ power rail 212. The pull-down element may include a fifth resistor 318 coupled to the data line 202 and a fifth switch 320 coupled between the fifth resistor and the ground reference 238 of the memory device 116. The resistance values of the parallel pull elements may be similar to or different from the other parallel element. In this example, the resistance values of pull elements that include resistors 314 and 318 nominally match the resistance values of the pull elements that include resistors 306 and 310.

Although not shown, the control circuitry 120 may be coupled to respective gates or control terminals of the switches 302, 308, 312, 316, and 320. Thus, the control circuitry 120 of the memory device 116 can selectively activate or deactivate the switches of the termination circuit and transmit circuit to implement aspects of termination for PAM signaling. For example, the control circuitry may activate the first switch 304 to couple the data line 202 (e.g., bi-direction signal line) to the termination power rail via the first resistor 302 as part of a receive mode with PAM termination. Alternatively, the control circuitry 120 can activate at least one of the second switch 308 or the third switch 310 to couple the bi-directional data line to VDDQ 212 via the second resistor 306 or the ground reference 238 via the third resistor 310 to implement a transmit mode with the first switch 304 deactivated in the transmit mode. Additional details for a transmit mode and current flows are described with reference to FIG. 4A and/or 4B.

With reference to the example configuration of the memory controller 108, the termination circuit 112 includes a first resistor 322 coupled to the data line 202 and a first switch 324 coupled between the first resistor 322 and the termination power rail 226 (e.g. a 40Ω pull-up to Vtt). The transmit circuit 242 includes, as part of a pull-up element, a second resistor 326 coupled to the data line 202 and a second switch 328 coupled to between the second resistor 326 and the VDDQ power rail 224 (e.g. an 80Ω pull-up to VDDQ). A pull-down element of the transmit circuit 242 includes a third resistor 330 coupled to the data line 202 and a third switch 332 coupled between the third resistor 330 and the ground reference 250 (e.g. an 80Ω pull-down to VSS). When implemented with parallel pull elements, the transmit circuit 242 may include a fourth resistor 334 coupled to the data line 202 and a fourth switch 336 coupled between the fourth resistor 334 and the VDDQ power rail 212. The pull-down element may include a fifth resistor 338 coupled to the data line 202 and a fifth switch 340 coupled between the fifth resistor 338 and the ground reference 238 of the memory device 116. The resistance values of the parallel pull elements may be similar to or different from the other parallel element. In this example, the resistance values of pull elements that include resistors 314 and 318 nominally match the resistance values of the pull elements that include resistors 306 and 310. As shown by the indicated resistance values, the pull-up and pull-down elements of the transmit circuit 242 may be balanced or matched, which may include same or similar resistance values within a ten percent tolerance range. In aspects, the pull-up and pull-down elements of the transmit circuit 242 may have a resistance value that matches the pull-up resistor of the termination circuit 122. Alternatively, the pull-up and pull-down elements of the transmit circuit 242 may be implemented as parallel elements, which may include a parallel 80Ω configuration (80∥80Ω) or a parallel 60∥120Ω configuration.

Although not shown, the control circuitry 228 may be coupled to respective gates or control terminals of the switches 324, 328, and 332. Thus, the control circuitry 228 of the memory controller 108 can selectively activate or deactivate the switches of the termination circuit and transmit circuit to implement aspects of termination for PAM signaling. For example, the control circuitry 228 may activate the first switch 324 to couple the data line 202 (e.g., bi-direction signal line) to the termination power rail via the first resistor 322 as part of a receive mode with PAM termination. Alternatively, the control circuitry 228 can activate at least one of the second switch 328 or the third switch 332 to couple the bi-directional data line to VDDQ 224 via the second resistor 326 or the ground reference 250 via the third resistor 330 to implement a transmit mode with the first switch 322 deactivated in the transmit mode. Additional details for a receive mode and current flows are described with reference to FIGS. 4A and 4B.

Figure 4A:
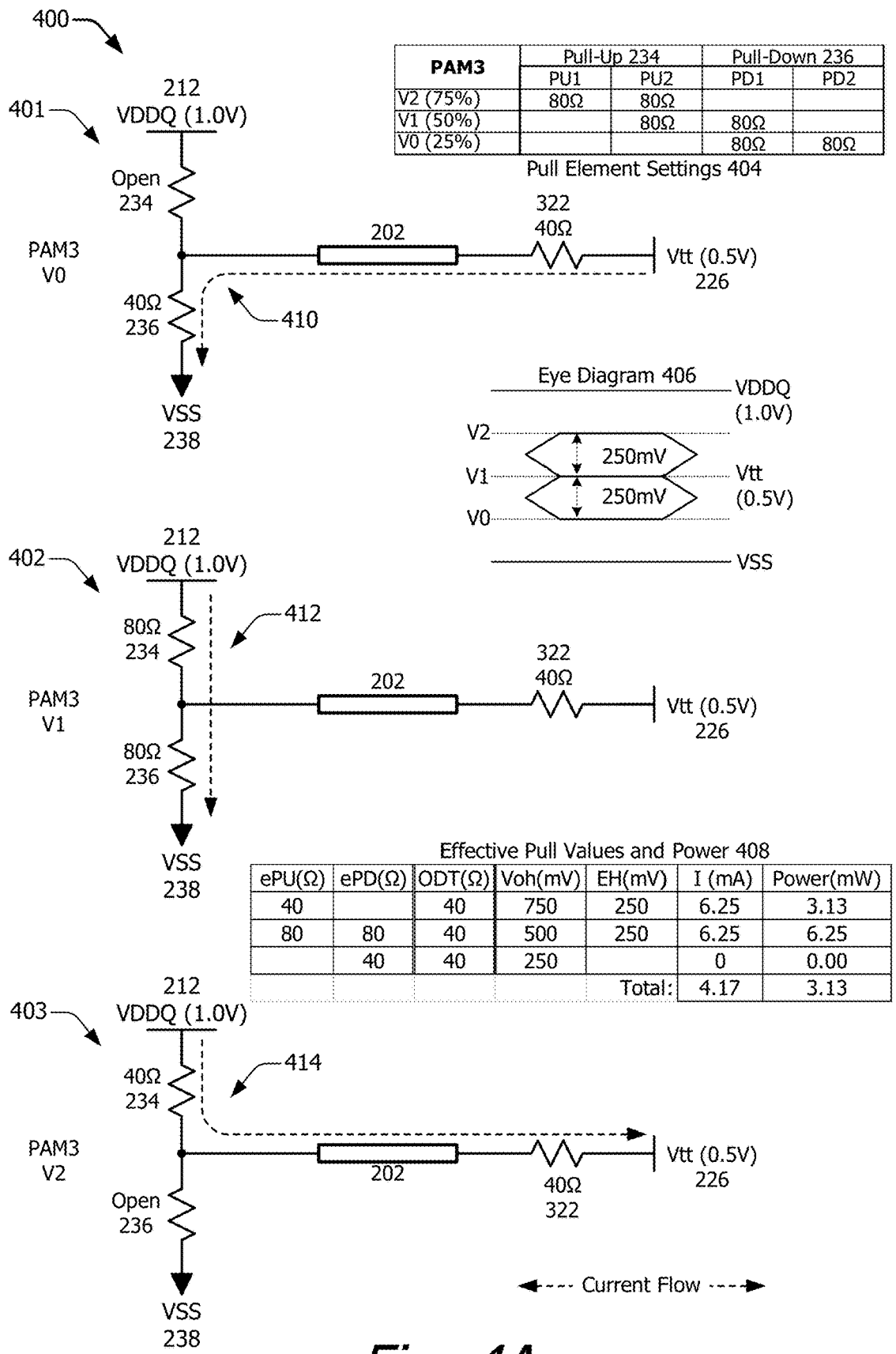
FIG. 4A illustrates examples of tri-level pulse amplitude modulation current flow in accordance with one or more aspects.

FIG. 4A illustrates at 400 examples of tri-level pulse amplitude modulation (PAM3) current flow in accordance with one or more aspects. Generally, respective control circuitry (e.g. transmit) of the memory controller 108 or memory device 116 selectively activates (e.g., based on data signals) pull elements of a transmit circuit to generate current flow and/or voltage signals to communicate data values to a receiving memory device or controller. Thus, the various examples described herein (e.g., circuits and operations) may be implemented in, by, or from the perspective of either of the memory controller 108 or memory device 116.

With reference to FIG. 4A, current flows are illustrated in the context of a memory device 116 transmitting data using PAM3 signaling (e.g., tri-level) with termination for PAM in accordance with one or more aspects. Specifically, 401 illustrates a first current flow for a PAM3 0 data value, 402 illustrates a second current flow for a PAM3 1 data value, and 403 illustrates a third current flow for a PAM3 2 data value. To do so, the signal mode controller 110, mode register 118, and/or respective control circuitry of the memory controller 108 or memory device 116 may selectively activate pull elements as shown in the table at 404 for pull element settings that correspond to the PAM3 signaling for the V0, V1, and V2 data values. As an example, transmission of these PAM3 values based on the termination voltage Vtt 214 or Vtt 226 set to 0.5V may result in received (terminated) signals that fall within an eye diagram 406 positive voltage signals for V2 and V1 centered with reference to the termination voltage. With parallel pull elements (e.g., 75∥75Ω, 60∥60Ω, 60∥120Ω, etc.), the effective resistance values of the pull-up element 234 and pull-down element 236 for the different PAM3 values are illustrated at 408, along with calculated current and power consumption associated with implementing aspects of termination for PAM signaling.

In the context of the present example, the resistor 322 of the termination circuit 112 of the memory controller 108 is active to terminate the data line 202 to the termination power rail Vtt 226. As shown at 401 and based on the pull element settings, the memory device 116 activates both pull-down resistors to cause current flow 410 to indicate the V0 PAM3 value to the memory controller 108. To indicate the V1 PAM3 value, the memory device 116 activates one resistor of each pull element to cause current flow 412 to indicate the PAM3 V1 value to the memory controller 108. Here, note that current flow 412 is present without current flow over the data line 202 or at the resistor of the termination circuit. Thus, in some signaling conditions, current flow at the receiver circuit (e.g., shunt path current in VSS termination) can be eliminated by implementing aspects of termination for PAM as described herein. As shown at 403 and based on the pull element settings, the memory device 116 activates both pull-up resistors to cause current flow 414 to indicate the V2 PAM3 value to the memory controller 108. As shown at 408, implementing aspects of termination for PAM signaling may result in low levels of power consumption (e.g., 3.13 mW).

Figure 4B:
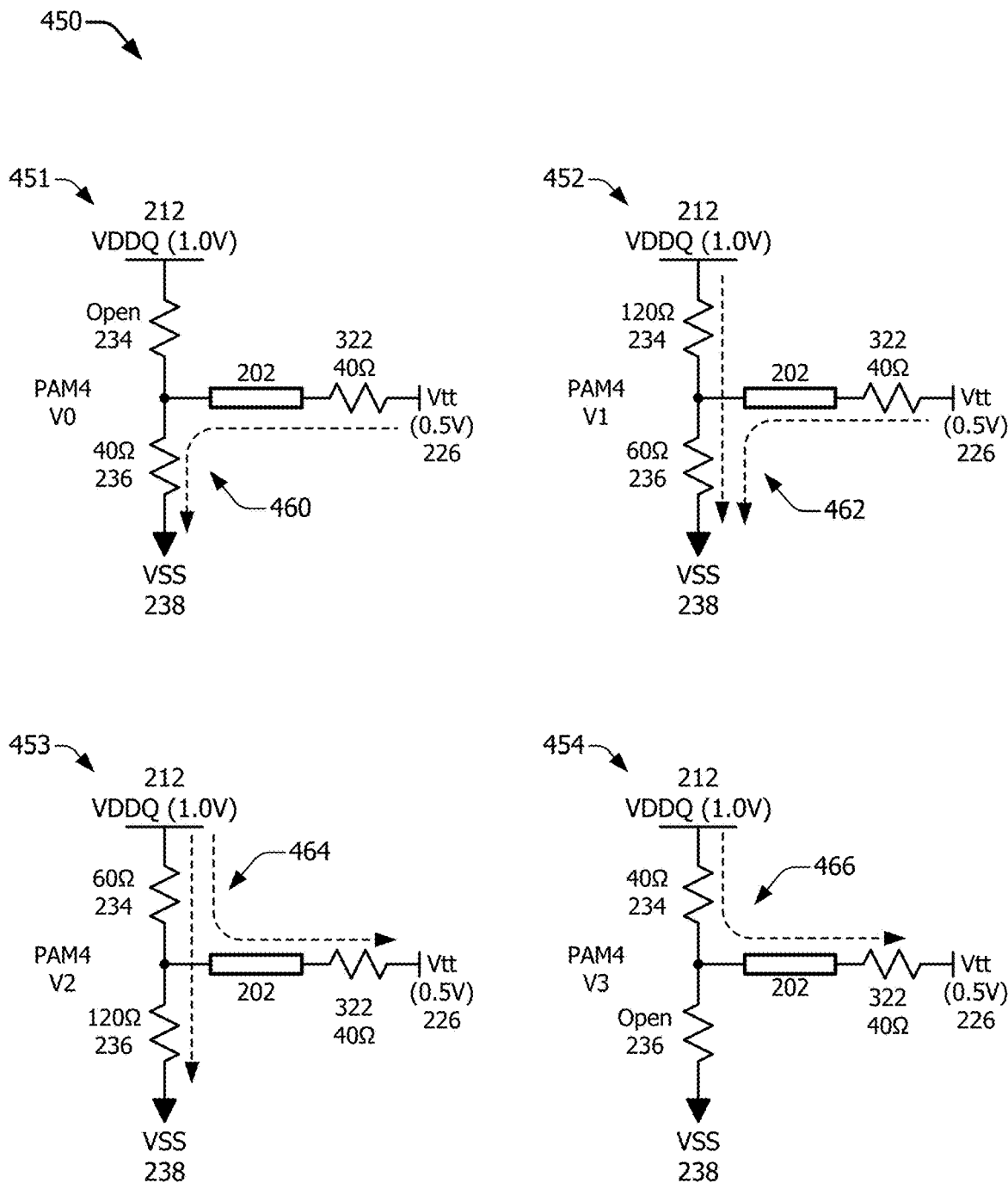
FIG. 4B illustrates examples of quad-level pulse amplitude modulation current flow in accordance with one or more aspects.

FIG. 4B illustrates at 450 an examples of quad-level pulse amplitude modulation (PAM4) current flow in accordance with one or more aspects. Generally, respective control circuitry of the memory controller 108 or memory device 116 selectively activates pull elements of a transmit circuit to generate current flow and/or voltage signals to communicate data values to a receiving memory device or controller. Thus, the various examples described herein (e.g., circuits and operations) may be implemented in, by, or from the perspective of either of the memory controller 108 or memory device 116.

With reference to FIG. 4B, current flows are illustrated in the context of a memory device 116 transmitting data using PAM4 signaling (e.g., quad-level) with termination for PAM in accordance with one or more aspects. Specifically, 451 illustrates a first current flow for a PAM4 0 data value, 452 illustrates a second current flow for a PAM4 1 data value, 453 illustrates a third current flow for a PAM4 2 data value, and 454 illustrates a fourth current flow for a PAM4 3 data value. To do so, the signal mode controller 110, mode register 118, and/or respective control circuitry of the memory controller 108 or memory device 116 may selectively activate pull elements as shown in the table at 456 for pull element settings that correspond to the PAM4 signaling for the V0, V1, V2, and V3 data values. With parallel pull elements (e.g., 60∥120Ω, 75∥125Ω, 50∥100Ω, etc.), the effective resistance values of the pull-up element 234 and pull-down element 236 for the different PAM3 values are illustrated at 408, along with calculated current and power consumption associated with implementing aspects of termination for PAM signaling.

In the context of the present example, the resistor 322 of the termination circuit 112 of the memory controller 108 is active to terminate the data line 202 to the termination power rail Vtt 226. As shown at 401 and based on the pull element settings 456, the memory device 116 activates both pull-down resistors to cause current flow 460 to indicate the V0 PAM4 value to the memory controller 108. To indicate the V1 PAM4 value, the memory device 116 activates one resistor of each pull element to cause current flow 462 to indicate the PAM4 V1 value to the memory controller 108. As shown at 403 and based on the pull element settings 456, the memory device 116 activates other resistors of each pull element to cause current flow 464 to indicate the PAM4 V2 value to the memory controller 108. To indicate the V3 PAM4 value, the memory device 116 activates both pull-up resistors to cause current flow 466 to the memory controller 108. As shown at 458, implementing aspects of termination for PAM signaling may result in low levels of power consumption (e.g., 3.73 mW). In some cases and as shown in Table 1, using the termination power rail Vtt as described herein in a same bandwidth condition relative to NRZ, may reduce power consumption by approximately four percent for PAM3 and approximately 17% for PAM4.

one signal level to another signal level. In aspects, the pre-emphasis pull elements may be implemented with resistance values greater or less than the primary pull elements of a transmit circuit. Generally, the pre-emphasis circuitry or a pre-emphasis driver with a higher resistance may be activated just before, during, or just after initiating a signaling transition (using other transmit circuitry) to another signal level, which may increase a slew rate or improve signaling eye patterns when implementing PAM or other signaling mode. For example, a pre-emphasis resistor may have a resistance value that is greater than twice a resistance value of a pull-up or pull-down resistor of the transmit or receive circuitry of the memory controller 108 or memory device 116. In this example, the pre-emphasis resistors are configured with a resistance value (320Ω) that is nominally eight times an effective or combined resistance (40Ω) of the parallel pull elements of the transmit circuit 230 (or nominally four times the individual pull element resistances).

With reference to the example configuration of the transmit circuit 230, the pre-emphasis circuitry includes, in relation to the previously described resistors, a sixth resistor 502 coupled to the data line 202 and a sixth switch 504 coupled between the sixth resistor 502 and the VDDQ power rail 212 (e.g., a 320Ω pull-up to VDDQ). The pre-emphasis circuitry also includes a seventh resistor 506 coupled to the data line 202 and a seventh switch 508 coupled to between the seventh resistor 506 and the ground reference 238 (e.g., a 320Ω pull-down to VSS). As shown by the indicated resistor values, the respective resistors 506 and 508 of the pull-up and pull-down elements of the pre-emphasis circuitry may be balanced or matched, which may include same or similar resistance values within a ten percent tolerance range. Although not shown, the pre-emphasis pull elements

TABLE 1

Power Consumption Comparison for NRZ vs PAM with Vtt Termination

| Bandwidth | Block | VSS Termination | | | Vtt Termination | | |
|---|---|---|---|---|---|---|---|
| | | NRZ | PAM3 | PAM4 | NRZ | PAM3 | PAM4 |
| 12.8 Gbps | Pre-Drv | 5.37 | 2.4 | 2.31 | <– | 2.4 | 2.31 |
| | Tx | 1.99 | 9.82 | 7.89 | <– | 6.16 | 4.74 |
| | Rx | 6.17 | 4.76 | 5.06 | <– | 4.76 | 5.06 |
| | WCK(read) | 3.17 | 2.12 | 1.79 | <– | 2.12 | 1.79 |
| | WCK(write) | 1.47 | 0.93 | 0.86 | <– | 0.93 | 0.86 |
| | Total | 9.8 | 12.18 | 10.48 | <– | 9.43 | 8.11 |
| | Total (%) | 100% | 124% | 107% | <– | 96% | 83% |

In addition to reduced power consumption, other advantage of provided by aspects of termination for PAM may include improved pre-emphasis, less duty cycle distortion, and/or increased driver linearity as described with reference to FIGS. 5-8.

Figure 5:
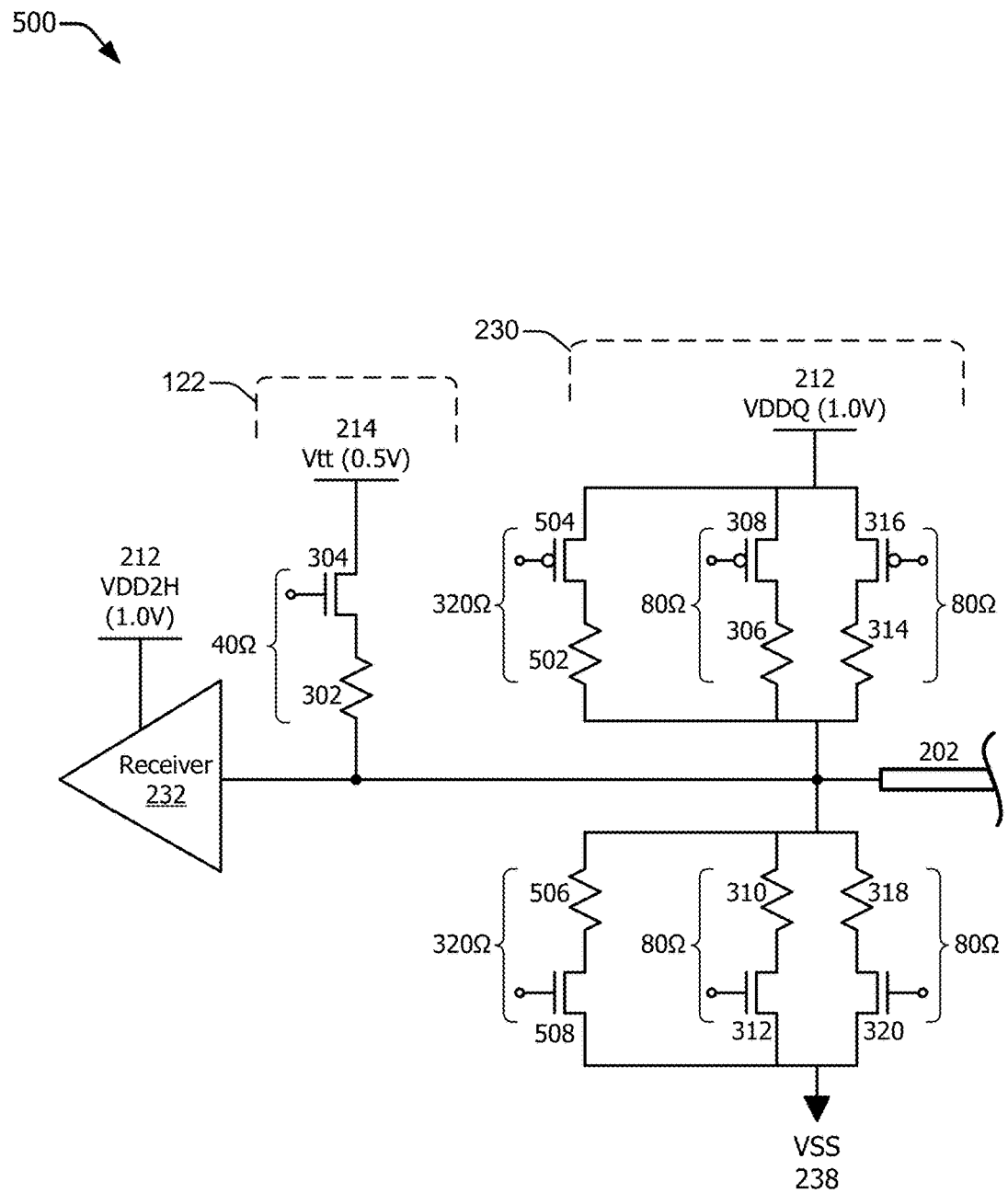
FIG. 5 illustrates an example of a termination circuit that includes pre-emphasis circuitry in accordance with one or more aspects.

FIG. 5 illustrates at 500 an example of a termination circuit that includes pre-emphasis circuitry in accordance with one or more aspects. Although shown implemented with reference to a transmit circuit 230 of the memory device 116, aspects of termination for PAM signaling may include circuits and/or techniques for pre-emphasis implemented in either the memory device 116 or memory controller 108. Thus, the pre-emphasis examples described herein (e.g., circuits and operations) may be implemented in, by, or from the perspective of either of the memory controller 108 or memory device 116.

As shown in FIG. 5, the transmit circuit 230 may include additional pull elements to enable pre-emphasis of signal transitions, which may include PAM signal transitions from may include additional parallel elements of same or different resistance values to enable varying levels or amounts of pre-emphasis. By implementing termination for PAM, which uses a non-ground or non-VDDQ termination voltage, the effects of VSS or VDDQ termination may be avoided and result in a more-balanced pre-emphasis effect on the PAM signals when using the termination power rail Vtt.

Figure 6A:
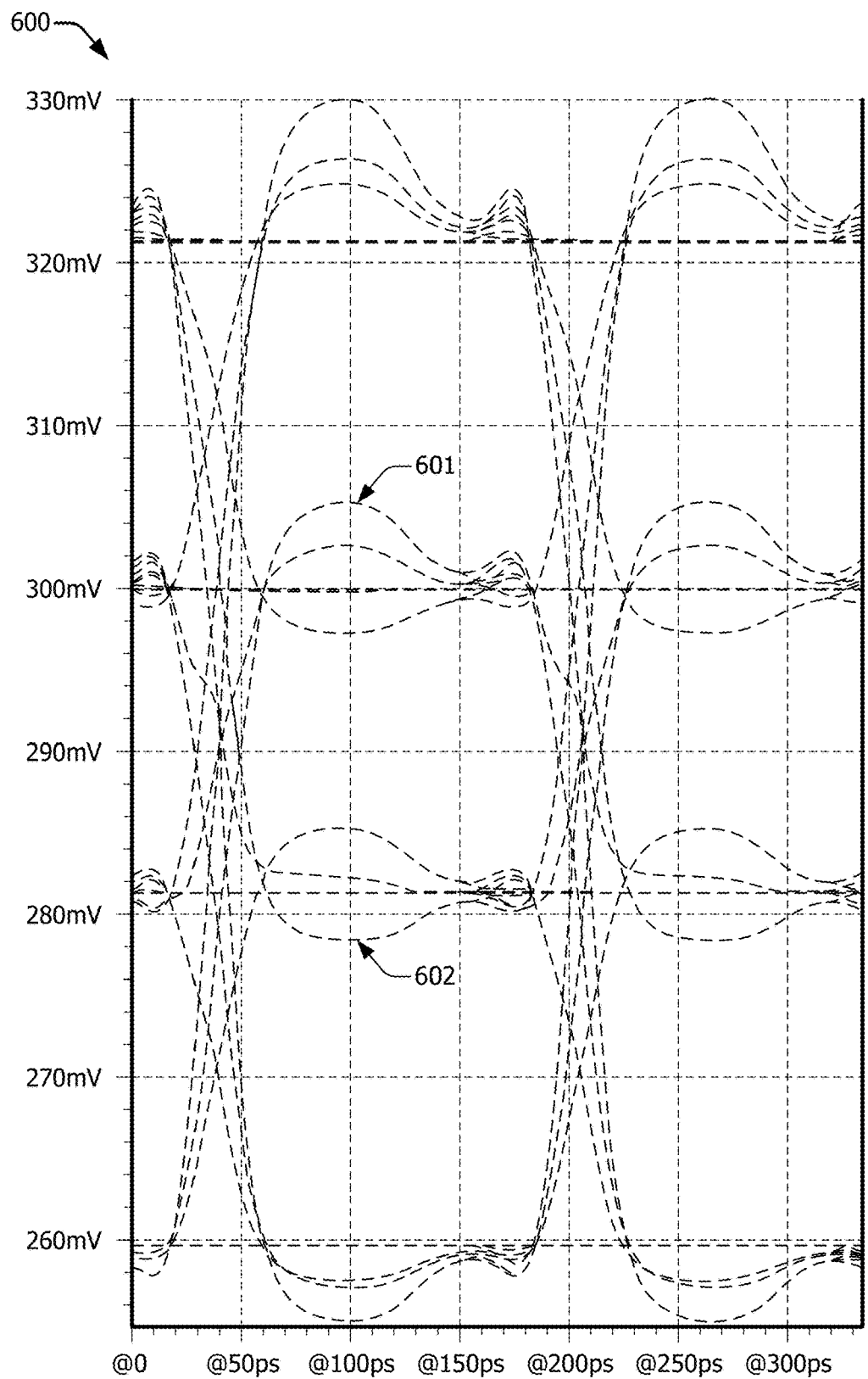
FIG. 6A illustrates an example plot of tri-level pulse amplitude modulation implemented with termination for pulse amplitude modulation.

By way of example, consider FIG. 6A, which illustrates at 600 a plot of tri-level PAM implemented with pre-emphasis and termination for pulse amplitude modulation. Here, note that the results illustrated in FIG. 6A may be experimental and voltages shown or described may not match results of a finalized or optimized circuit design for termination for pulse amplitude modulation. As shown at 601, implementing a termination to the termination power rail Vtt (e.g., Vtt 214, Vtt 226) as described herein enables a pull-up pre-emphasis to function without distortion on upward signal transitions. Likewise, at 602, using a termination to the termination power rail Vtt (e.g., Vtt 214, Vtt 226) as described herein enables a pull-down pre-emphasis to function without distortion on downward signal transitions. Thus, aspects of termination for PAM signaling can be implemented in combination with pre-emphasis, which may improve signal integrity or avoid signal distortion associated with VS S-based or VDDQ-based terminations.

Figure 6B:
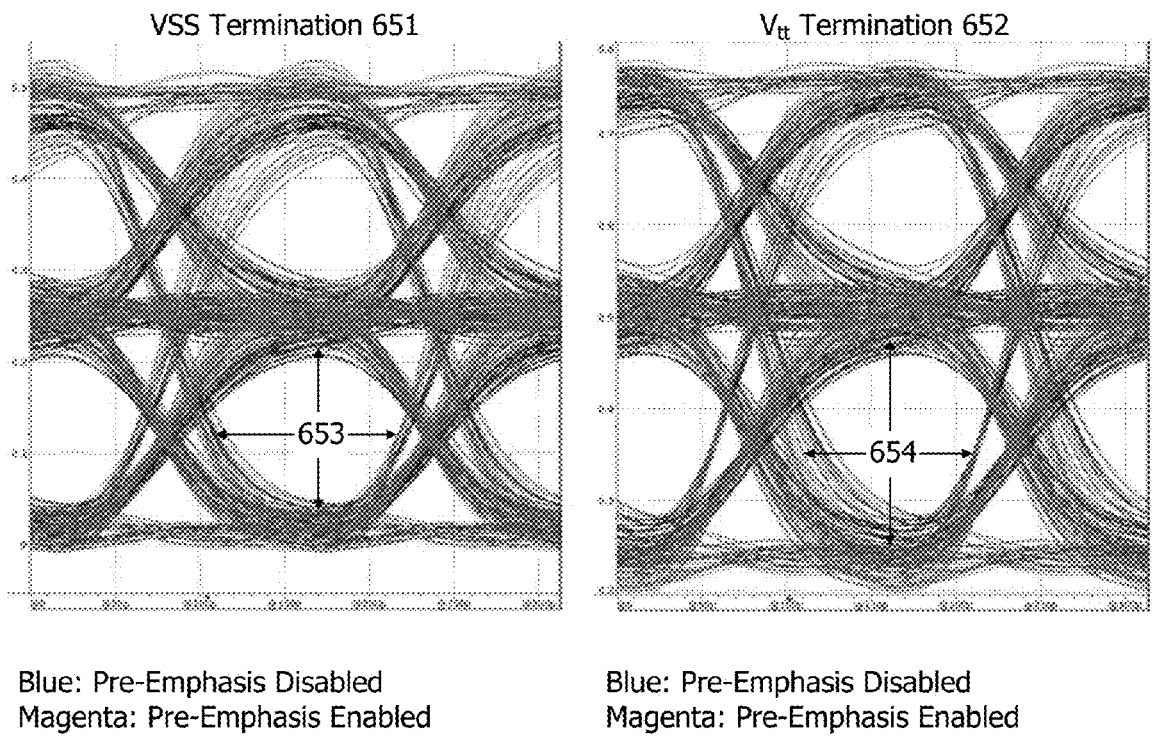
FIG. 6B illustrates example plots of pre-emphasis applied with pulse amplitude modulation in accordance with one or more aspects.

As another example, consider FIG. 6B, which illustrates example plots of pre-emphasis applied with pulse amplitude modulation in accordance with one or more aspects. For comparison, a plot of VSS termination is shown at 651 and a plot of Vtt termination is shown at 652, each with and without pre-emphasis enabled. As noted in the legend of FIG. 6B, the blue lines represent signal patterns with pre-emphasis disabled and the magenta lines represent signal patterns of the respective terminations with pre-emphasis enabled. Relative the eye pattern at 653, aspects of termination for pulse amplitude modulation may provide an improved eye pattern 654 when pre-emphasis is enabled with a wider window height and/or a longer window duration.

Figure 7:
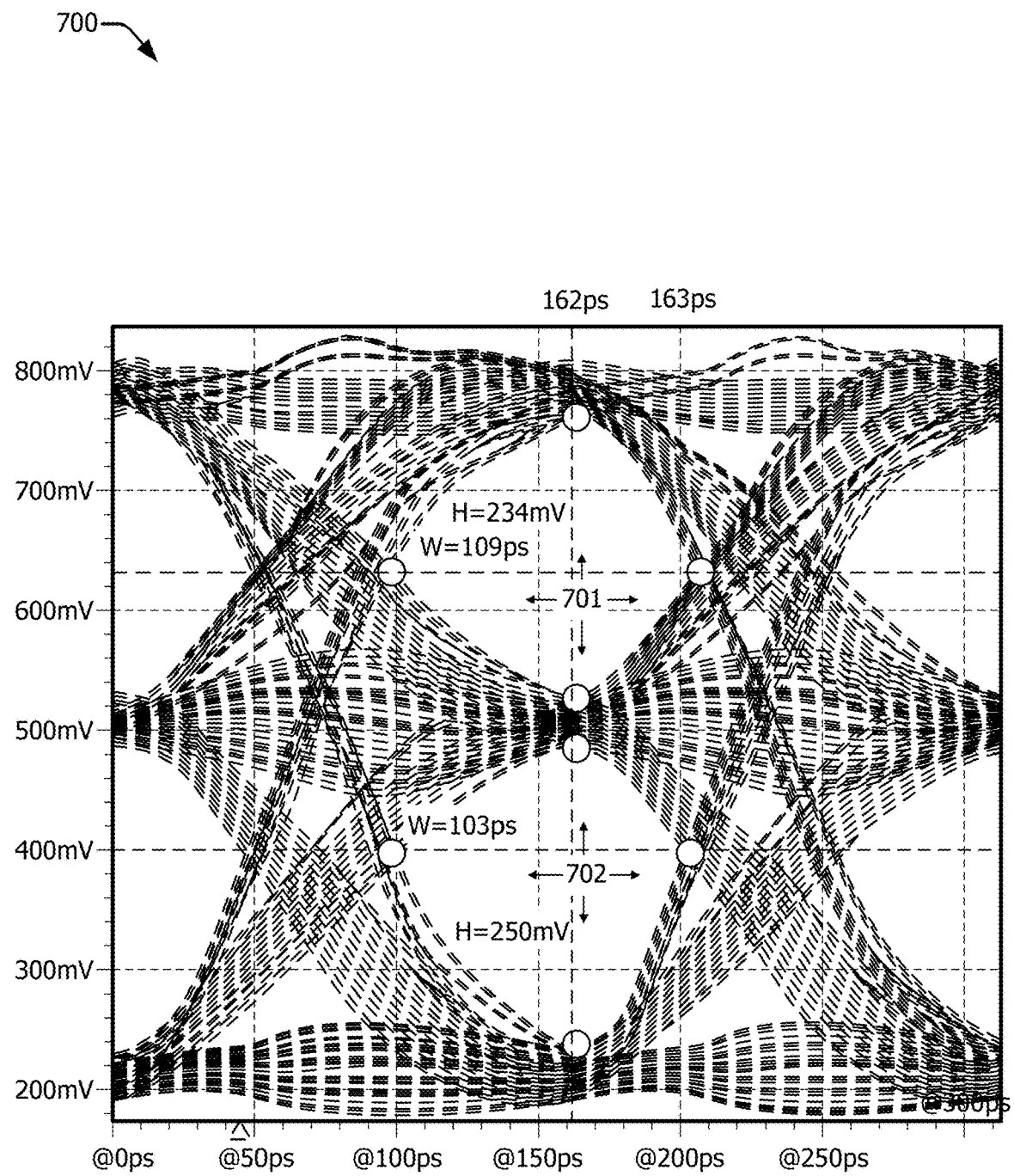
FIG. 7 illustrates an example eye diagram associated with various aspects of termination for pulse amplitude modulation.

FIG. 7 illustrates at 700 an example eye diagram associated with various aspects of termination for pulse amplitude modulation. Generally, aspects of termination for PAM signaling may also improve duty cycle distortion or transmitter linearity of a memory circuit. For example, a VSS termination or a VDDQ termination of a memory circuit typically results in a respective duty cycle distortion of approximately 46% or 54%. By using a termination power rail Vtt (e.g., Vtt 214, Vtt 226) as described herein, however, a duty cycle distortion may be reduced or substantially eliminated (e.g., a nominal 50% duty cycle).

Additionally, due to the additional signaling levels associated with PAM, eye pattern issues may arise, particularly with poor signal line driver linearity or DQ calibration. For example, NRZ signaling operates based on two signal levels and one signal eye, while PAM4 operates based on four signal levels and three signal eyes within a similar voltage profile (e.g., 1.0V). When a signal line driver suffers from poor linearity, the already small signal eyes are reduced further, which can prevent proper signal recovery by a receiving input buffer. Some of these linearity issues may relate to an unbalanced or asymmetric termination scheme that uses VSS or VDDQ as a termination rail. To address such issues, a memory controller can implement multiple ZQ calibrations at each I/O output for each output voltage to generate separate ZQ calibration codes for all combinations of signal levels.

In aspects of termination for PAM, however, the use of the termination power rail Vtt may provide more-balanced or symmetric waveforms that reduce calibration and/or equalization complexities of a memory circuit. For example, as shown at 701 and 702, terminating a signal line to the termination power rail Vtt may provide higher and/or longer signal eyes that are symmetric about the termination voltage. As such, aspects of termination for PAM may enable simplified DQ calibration procedures, which may enable signal line driver calibration using as few as one DQ calibration based on the termination voltage (e.g., one DQ calibration at one half VDDQ, 0.5V).

Figure 8:
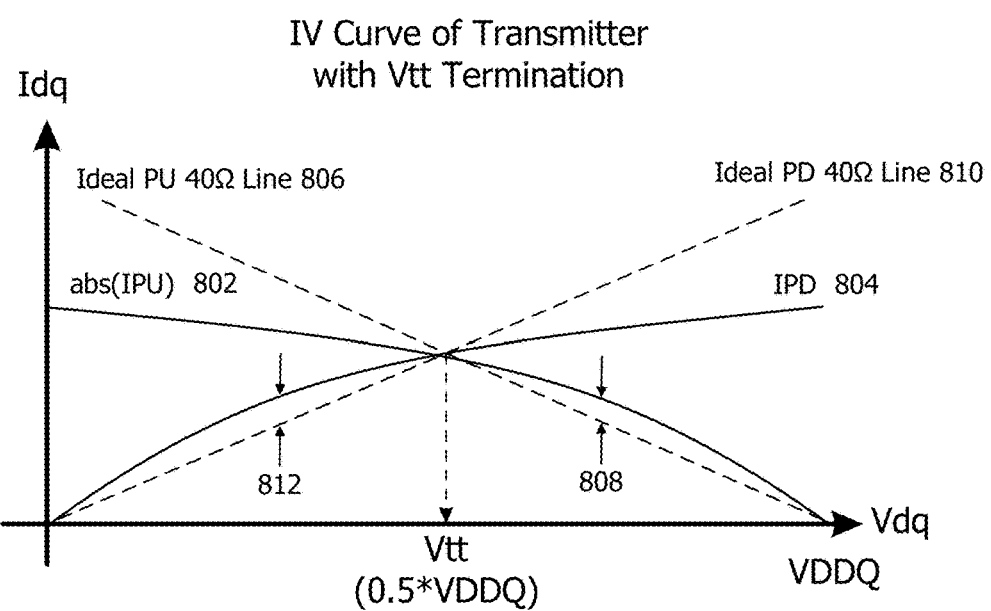
FIG. 8 illustrates an example current-voltage plot of a receiver circuit implemented with termination for pulse amplitude modulation.

By way of example, consider FIG. 8, which illustrates at 800 a current-voltage plot of a transmitter circuit implemented with termination for pulse amplitude modulation. In this current-voltage plot, pull-up current 802 and pull-down current 804 are balanced or symmetric about the termination voltage Vtt, instead of being skewed toward VSS or VDDQ by preceding types of termination circuits. Additionally, the pull-up current 802 is closer to an ideal pull-up impedance 806, with a difference 808 that is reduced relative a VSS terminated signal line. Likewise, the pull-down current 804 is closer to an ideal pull-down impedance 810, with a difference 812 that is reduced relative a VDDQ terminated signal line. As such, aspects of termination of PAM signaling as described herein may provide a number of performance improvements, which may include reduced power consumption, less duty cycle distortion, improved pre-emphasis, increased transmitter drive linearity, and/or simplified calibration procedures.

EXAMPLE METHODS

Figure 9:
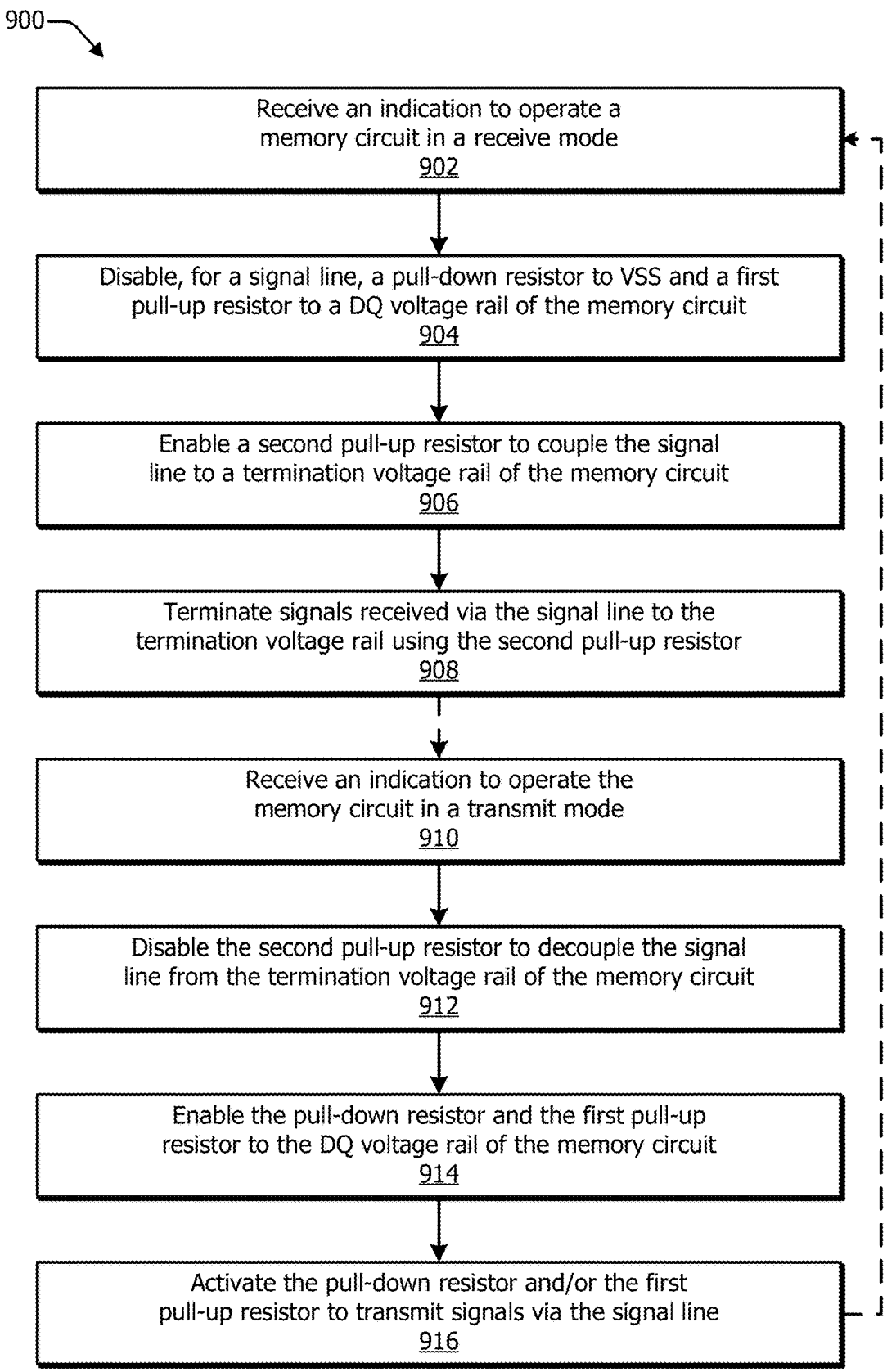
FIG. 9 illustrates an example method for operating a memory circuit with termination for pulse amplitude modulation.
Figure 10:
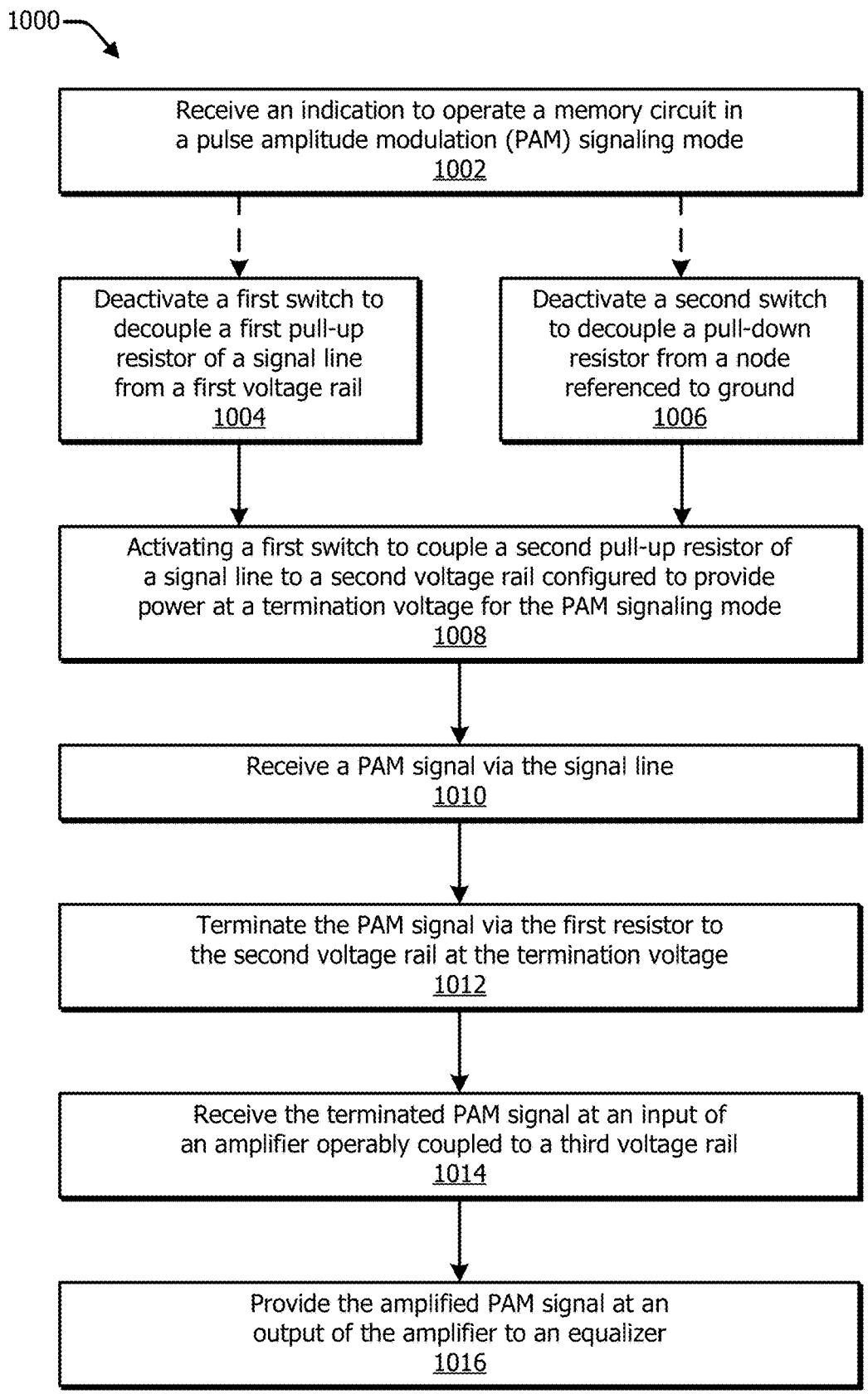
FIG. 10 illustrates an example method for termination of a pulse amplitude modulation signal in accordance with one or more aspects.

Example methods are described in this section with reference to the flow charts and flow diagrams of FIGS. 9 and 10. These descriptions reference components, entities, and other aspects depicted in FIGS. 1-8 by way of example only.

FIG. 9 depicts a flow diagram 900 of an example method for operating a memory circuit with termination for pulse amplitude modulation in accordance with one or more aspects. The flow diagram 900 includes operations 902 through 916, which may be performed using a termination circuit 112 or termination circuit 122 to implement aspects of termination for pulse amplitude modulation as described herein.

At 902, control circuitry of a termination circuit receives an indication to operate a memory circuit in a receive mode. For example, a memory device may be configured for a write operation of data to the memory device, or a memory controller may be configured for a read operation of data from the memory device.

At 904, the control circuitry disables, for a data line of a memory interconnect, a pull-down resistor and a pull-up resistor to a DQ power rail (e.g., VDDQ, 1.0V) of the memory circuit. In some cases, the control circuitry disables a transmit circuit or decouples components of the transmit circuit from the data line.

At 906, the control circuitry enables a second pull-up resistor to couple the data line of the memory interconnect to a termination power rail of the memory circuit. For example, the control circuitry may activate a switch of a termination circuit to couple a termination resistor or pull-up resistor to the data line. The termination power rail may be configured as described herein, which may include a voltage that is nominally one half a voltage of DQ line driving circuitry of a transmit circuit coupled to the data line.

At 908, the memory circuit terminates signals received via the data line to the termination power rail using the second pull-up resistor. For example, the memory circuit may terminate PAM3 or PAM4 signals using the termination power rail and corresponding pull resistor of the termination circuit. Alternatively, the memory circuit may use the termination circuit to terminate NRZ signals.

Optionally at 910, the control circuitry receives an indication to operate in a transmit mode. For example, the memory device may be configured for a read operation of data to the memory controller, or a memory controller may be configured for a write operation of data to the memory device.

At 912, the control circuitry disables the second pull-up resistor to decouple the data line of the memory interconnect from the termination power rail of the memory circuit. In some cases, the control circuitry opens or deactivates a switch of the termination circuit to uncouple the termination resistor from the data line. Additionally, the control circuitry may disable or deactivate an input buffer or receive amplifier of the memory circuit.

At 914, the control circuitry enables the pull-down resistor and the first pull-up resistor to the DQ power rail of the memory circuit. For example, the control circuit may enable pull elements, such as parallel pull-ups or parallel pull-downs, of a transmit circuit coupled to the data line.

At 916, the control circuitry activates the pull-down resistor and/or the first pull-up resistor to transmit signals via the data line of the memory interconnect. In some cases, the control circuitry activates one or more switches of a pull-up element to source current to the data line. In other cases, the control circuitry activates a pull-up and a pull-down to shunt current and transmit a voltage signal over the data line. In yet other cases, the control circuitry activates one or more switches of a pull-down element to sink current from the data line. Optionally from operation 916, the method 900 may return to operation 902 to implement termination for pulse amplitude modulation in response to receiving another indication to operate the memory circuit in the receive mode.

FIG. 10 depicts a flow diagram 1000 of an example method for termination of a pulse amplitude modulation signal in accordance with one or more aspects. The flow diagram 1000 includes operations 1002 through 1016, which may be performed using a termination circuit 112 or termination circuit 122 to implement aspects of termination for pulse amplitude modulation as described herein.

At 1002, control circuitry of a termination circuit receives an indication to operate in a PAM signaling mode. For example, a signal mode controller or mode register may configure a memory circuit to operate in the PAM signaling mode.

Optionally at 1004, the control circuitry deactivates a first switch to decouple a first pull-up resistor of a data line from a first power rail. Optionally at 1006, the control circuitry deactivates a second switch to decouple a pull-down resistor of the data line from a node referenced to ground. By so doing, the control circuitry may disable a transmit circuit of the memory circuit by decoupling or opening pull elements configured to enable transmit operations.

At 1008, the control circuitry activates a third switch to couple a second pull-up resistor of the data line to a second power rail. The second power rail is configured to provide power at a termination voltage for the PAM signaling mode. The second pull resistor and the second power rail may be implemented as a termination circuit as described herein.

At 1010, the memory circuit receives a PAM signal via the data line. The PAM signal may include a data value modulated in accordance with a PAM3 or a PAM4 signaling protocol or specification. Alternatively, the memory circuit may be configured for and receive NRZ signals for termination using the termination power rail. In aspects, the circuits and techniques described herein may also be applied to NRZ signaling modes, which may reduce power consumption while operating the memory circuit in those modes.

At 1012, the termination circuit terminates the PAM signal via the second pull-up resistor to the second power rail at the termination voltage to provide a terminated PAM signal. At 1014, an amplifier of the memory circuit receives the terminated PAM signal. In aspects, the amplifier is operably coupled to a third power rail (e.g., VDD2H) configured to provide power at a voltage level that is nominally twice the termination voltage.

At 1016, the amplifier provides the amplified PAM signal to an equalizer of the memory circuit. Alternatively, the amplifier can provide the amplified PAM signal to a de-serializer of the memory circuit. By implementing aspects of termination for pulse amplitude modulation, signal integrity of the amplified PAM signal may be improved, and power consumption of the memory circuit may be reduced.

For the flow charts and flow diagrams described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods or operations may be implemented in, for example, hardware (e.g., fixed-logic circuitry or a processor in conjunction with a memory), firmware, or some combination thereof. The methods may be realized using one or more of the apparatuses, systems, or components shown in FIGS. 1-10, the components of which may be further divided, combined, rearranged, and so on. The devices, systems, and components of these figures generally represent firmware, such as executable-code or the actions thereof; hardware, such as electronic devices, packaged modules, IC chips, or circuits; software, such as processor-executable instructions; or a combination thereof. The illustrated apparatuses 100 and components shown at 200, 300, 400, and/or 500, include, for instance, a memory controller 108, a signal mode controller 110, a termination circuit 112, an interconnect 114, a memory device 116, control circuitry 120, a termination circuit 122, and a memory die 124. A host device 102 can include a processor 106 and a memory controller 108. A memory device 116 may include a mode register 118, control circuitry 120, a termination circuit 122, and memory die 124. An instance of the memory controller 108 or the memory device 116 may include multiple power supplies and a power distribution network (PDN) to provide power at multiple respective voltage levels to enable aspects of termination for pulse amplitude modulation or other signaling modes. Thus, these figures illustrate some of the many possible systems or apparatuses capable of implementing the described methods.

In the following, various examples of termination of a pulse amplitude modulation signal of a memory circuit are described:

Example 1: An apparatus comprising: at least one memory array comprising multiple memory banks; an interface for a memory interconnect; control logic configured to enable access to the at least one memory array using the interface for the memory interconnect; a power distribution network comprising a first power rail configured to provide first power at a first voltage and a second power rail configured to provide second power at a second voltage, the first voltage of the first power rail being less than the second voltage of the second power rail; and a transceiver circuit comprising: an amplifier having an input coupled to a signal line of the interface and an output coupled to the control logic; a first resistor having a first terminal coupled to the signal line; a first switch coupled between a second terminal of the first resistor and a first power rail; a second resistor having a first terminal coupled to the signal line; a second switch coupled between a second terminal of the second resistor and a node configured to sink current; a third resistor having a first terminal coupled to the signal line; and a third switch coupled between the second terminal of the third switch and a second power rail.

Example 2: The apparatus as recited in example 1 or any other example, wherein the first voltage at which the first power rail is configured to provide the first power is nominally one half of the second voltage at which the second power rail is configured to provide the second power.

Example 3: The apparatus as recited in example 1 or any other example, wherein: the power distribution network further comprises a third power rail configured to provide third power at a third voltage that is different from the first voltage of the first power rail; and the amplifier of the transceiver circuit is coupled to the third power rail.

Example 4: The apparatus as recited in example 3 or any other example, wherein the first voltage at which the first power rail is configured to provide the first power is nominally one half of the third voltage at which the third power rail is configured to provide the third power to the amplifier.

Example 5: The apparatus as recited in example 1 or any other example, wherein: a resistance value of the first resistor is within a ten percent tolerance range of one half of a resistance value of the second resistor; or the resistance value of the first resistor is within a ten percent tolerance range of one half of a resistance value of the third resistor.

Example 6: The apparatus as recited in example 1 or any other example, wherein the transceiver circuit further comprises: a fourth resistor having a first terminal coupled to the signal line of the interface; a fourth switch coupled between a second terminal of the fourth resistor and the node configured to sink current; a fifth resistor having a first terminal coupled to the signal line of the interface; and a fifth switch coupled between the second terminal of the fifth switch and the second power rail.

Example 7: The apparatus as recited in example 6 or any other example, wherein: a resistance value of the second resistor matches a resistance value of the fourth resistor within a tolerance range of ten percent; or a resistance value of the third resistor matches a resistance value of the fifth resistor within a tolerance range of ten percent.

Example 8: The apparatus as recited in example 6 or any other example, wherein the resistance value of the second resistor, the resistance value of the third resistor, the resistance value of the fourth resistor, and the resistance value of the fifth resistor match within a tolerance range of ten percent.

Example 9: The apparatus as recited in example 1 or any other example, wherein the transceiver circuit further comprises: a sixth resistor having a first terminal coupled to the signal line of the interface; a sixth switch coupled between a second terminal of the sixth resistor and the node configured to sink current; a seventh resistor having a first terminal coupled to the signal line of the interface; and a seventh switch coupled between a second terminal of the seventh resistor and the node configured to sink current.

Example 10: The apparatus as recited in example 9 or any other example, wherein: a resistance value of the sixth resistor is less than half of a resistance value of the third resistor or a resistance value of the fifth resistor; and a resistance value of the seventh resistor is less than half of the resistance value of the third resistor or the resistance value of the fifth resistor.

Example 11: The apparatus as recited in example 9 or any other example, wherein: the control logic of the apparatus comprises write path circuitry to which the output of the amplifier is coupled, and the write path circuitry including one of: a de-serializer circuit; an equalizer circuit; or a decision feedback equalizer circuit.

Example 12: The apparatus as recited in example 1 or any other example, wherein the control logic is configured to enable access to the at least one memory array in accordance with a Low-Power Double Data Rate (LPDDR) specification.

Example 13: An apparatus comprising: an amplifier having an input and an output, the output of the amplifier coupled to a de-serializer circuit; a signal line coupled to the input of the amplifier; a first resistor having a first terminal coupled to the signal line; a first switch coupled between a second terminal of the first resistor and a first power rail, the first power rail configured to provide first power at a first voltage; a second resistor having a first terminal coupled to the signal line; a second switch coupled between a second terminal of the second resistor and a node configured to sink current; a third resistor having a first terminal coupled to the signal line; and a third switch coupled between the second terminal of the third switch and a second power rail, the second power rail configured to provide second power at a second voltage that is less than the first voltage of the first power.

Example 14: The apparatus as recited in example 13 or any other example, wherein the first voltage at which the first power rail is configured to provide the first power is less than two thirds of the second voltage at which the second power rail is configured to provide the second power.

Example 15: The apparatus as recited in example 13 or any other example, wherein the first voltage at which the first power rail is configured to provide the first power is nominally one half of the second voltage at which the second power rail is configured to provide the second power.

Example 16: The apparatus as recited in example 13 or any other example, wherein the amplifier is coupled to a third power rail configured to provide third power at a third voltage that is different from the first voltage of the first power provided by the first power rail.

Example 17: The apparatus as recited in example 16 or any other example, wherein the first voltage at which the first power rail is configured to provide the first power is nominally one half of the third voltage at which the third power rail is configured to provide the third power to the amplifier.

Example 18: The apparatus as recited in example 13 or any other example, wherein: a resistance value of the first resistor is within a ten percent tolerance range of one half of a resistance value of the second resistor; or the resistance value of the first resistor is within a ten percent tolerance range of one half of a resistance value of the third resistor.

Example 19: The apparatus as recited in example 13 or any other example, wherein a resistance value of the first resistor matches a resistance value of the second resistor within a tolerance range of ten percent; or the resistance of the first resistor matches a resistance value of the third resistor within a tolerance range of ten percent.

Example 20: The apparatus as recited in example 13 or any other example, further comprising: a fourth resistor having a first terminal coupled to the signal line; a fourth switch coupled between a second terminal of the fourth resistor and the node configured to sink current; a fifth resistor having a first terminal coupled to the signal line; and a fifth switch coupled between the second terminal of the fifth switch and the second power rail.

Example 21: The apparatus as recited in example 20 or any other example, wherein: a resistance value of the second resistor matches a resistance value of the fourth resistor within a tolerance range often percent; or a resistance value of the third resistor matches a resistance value of the fifth resistor within a tolerance range of ten percent.

Example 22: The apparatus as recited in example 20 or any other example, wherein the resistance value of the second resistor, the resistance value of the third resistor, the resistance value of the fourth resistor, and the resistance value of the fifth resistor match within a tolerance range of ten percent.

Example 23: The apparatus as recited in example 20 or any other example, further comprising: a sixth resistor having a first terminal coupled to the signal line; a sixth switch coupled between a second terminal of the six resistor and the node configured to sink current; a seventh resistor having a first terminal coupled to the signal line; and a seventh switch coupled between the second terminal of the seventh resistor and the second power rail.

Example 24: The apparatus as recited in example 13 or any other example, wherein: a resistance value of the sixth resistor is less than half of a resistance value of the third resistor or a resistance value of the fifth resistor; or a resistance value of the seventh resistor is less than half of the resistance value of the third resistor or the resistance value of the fifth resistor.

Example 25: The apparatus as recited in example 13 or any other example, wherein: the signal line comprises a bi-directional data line; the apparatus is configured as or part of a transceiver circuit for the bi-directional data line, the transceiver circuit comprising: a receiver portion that includes the amplifier, the first switch, and the first resistor; and a transmitter portion that includes the second switch, second resistor, third switch, and third resistor.

Example 26: The apparatus as recited in example 25 or any other example, wherein the transceiver circuit is coupled with control circuitry configured to: activate the first switch to couple the bi-directional data line to the first power rail via the first resistor to implement a receive mode, the second switch and third switch deactivated in the receive mode; or activate at least one of the second switch or the third switch to couple the bi-directional data line to the node configured to sink current via the second resistor or to the second power rail via the third resistor to implement a transmit mode, the first switch deactivated in the transmit mode.

Example 27: The apparatus as recited in example 13 or any other example, wherein: the output of the amplifier is coupled to the de-serializer circuit via an equalizer circuit; or the amplifier is implemented as part of the equalizer circuit, the equalizer circuit coupled to the de-serializer.

Example 28: The apparatus as recited in example 27 or any other example, wherein the de-serializer circuit is configured as a decision feedback equalizer circuit.

Example 29: An apparatus comprising: an interface for a memory interconnect; control logic configured to enable communication of data through the interface; a power distribution network that includes a first power rail to provide first power at a first voltage and a second power rail to provide second power at a second voltage, the first voltage being less than two thirds the second voltage; and a transceiver circuit comprising: an amplifier having an input coupled to a signal line of the interface and an output coupled to the control logic; a first resistor having a first terminal coupled to the signal line; a first switch coupled between a second terminal of the first resistor and a first power rail; a second resistor having a first terminal coupled to the signal line; a second switch coupled between a second terminal of the second resistor and a node configured to sink current; a third resistor having a first terminal coupled to the signal line; and a third switch coupled between the second terminal of the third switch and a second power rail.

Example 30: The apparatus as recited in example 29 or any other example, wherein the first voltage at which the first power rail is configured to provide the first power is nominally one half of the second voltage at which the second power rail is configured to provide the second power.

Example 31: The apparatus as recited in example 29 or any other example, wherein: the power distribution network further comprises a third power rail configured to provide third power at a third voltage that is different from the first voltage of the first power rail; and the amplifier of the transceiver circuit is coupled to the third power rail.

Example 32: The apparatus as recited in example 31 or any other example, wherein the first voltage at which the first power rail is configured to provide the first power is nominally one half of the third voltage at which the third power rail is configured to provide the third power to the amplifier.

Example 33: The apparatus as recited in example 29 or any other example, wherein: a resistance value of the first resistor is within a ten percent tolerance range of one half of a resistance value of the second resistor; or the resistance value of the first resistor is within a ten percent tolerance range of one half of a resistance value of the third resistor.

Example 34: The apparatus as recited in example 29 or any other example, wherein: a resistance value of the first resistor matches a resistance value of the second resistor within a tolerance range of ten percent; or the resistance of the first resistor matches a resistance value of the third resistor within a tolerance range of ten percent.

Example 35: The apparatus as recited in example 29 or any other example, wherein: the control logic of the apparatus comprises read path circuitry to which the output of the amplifier is coupled, and the read path circuitry including one of: a de-serializer circuit; an equalizer circuit; or a decision feedback equalizer circuit.

Example 36: The apparatus as recited in example 29 or any other example, wherein the control logic of the apparatus is configured to enable the communication of the data through the interface in accordance with a Low-Power Double Data Rate (LPDDR) specification.

Example 37: A method comprising: receiving an indication to operate a memory circuit in a receive mode, the memory circuit coupled to a memory interconnect; disabling a pull-down resistor coupled between a signal line of the memory interconnect and a node configured to sink current; disabling a first pull-up resistor coupled between the signal line of the memory interconnect and a first power rail configured to provide first power at a first voltage; enabling a second pull-up resistor coupled between the signal line and a second power rail configured to provide second power at a second voltage that is nominally half of the first voltage; and receiving, by an amplifier of the memory circuit, signals via the signal line of the memory interconnect that is coupled to the second power rail by the second pull-up resistor.

Example 38: The method as recited in example 37 or any other example, wherein the amplifier of the memory circuit is coupled to a third power rail configured to provide third power at a third voltage that is nominally twice the second voltage of the second power rail.

Example 39: The method as recited in example 37 or any other example, further comprising: amplifying the signals received via the signal line using the amplifier; and providing, from the amplifier, the amplified signals to an equalizer or de-serializer of the memory circuit.

Example 40: The method as recited in example 37 or any other example, wherein: a resistance value of the pull-down resistor is nominally twice a resistance value of the second pull-up resistor; or a resistance value of the first pull-up resistor is nominally twice the resistance value of the second pull-up resistor.

Example 41: The method as recited in example 37 or any other example, wherein: a resistance value of the pull-down resistor matches a resistance value of the second pull-up resistor within a tolerance range of ten percent; or a resistance value of the first pull-up resistor matches the resistance value of the second pull-up resistor within a tolerance range of ten percent.

Example 42: The method as recited in example 37 or any other example, wherein: the memory circuit is implemented in a memory device that is configured to operate in accordance with a Low-Power Double Data Rate (LPDDR) specification.

Example 43: The method as recited in example 37 or any other example, wherein: the memory circuit is implemented in a memory controller integrated-circuit that is configured to operate in accordance with an LPDDR specification.

In the context of the present disclosure, computer-readable media includes both non-transitory computer storage media and communication media, including any medium that facilitates transfer of a computer program (e.g., an application) or data from one entity to another. Non-transitory computer storage media can be any available medium accessible by a computer, such as RAM, SRAM, DRAM, ROM, Flash, EEPROM, optical media, and magnetic media.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although aspects of termination for pulse amplitude modulation have been described in language specific to certain features and/or methods, the subject matter of the appended claims is not necessarily limited to the specific features or methods described. Rather, the specific features and methods are disclosed as a variety of example implementations of termination for pulse amplitude modulation.

What is claimed is:

1. An apparatus comprising:
at least one memory array comprising multiple memory banks;
an interface for a memory interconnect;
control logic configured to enable access to the at least one memory array using the interface for the memory interconnect;
a power distribution network comprising a first power rail configured to provide first power at a first voltage and a second power rail configured to provide second power at a second voltage, the first voltage of the first power rail being less than the second voltage of the second power rail; and
a transceiver circuit comprising:
an amplifier having an input coupled to a signal line of the interface and an output coupled to the control logic;
a first resistor having a first terminal coupled to the signal line;
a first switch coupled between a second terminal of the first resistor and the first power rail;
a second resistor having a first terminal coupled to the signal line;
a second switch coupled between a second terminal of the second resistor and a node configured to sink current;
a third resistor having a first terminal coupled to the signal line; and
a third switch coupled between a second terminal of the third resistor and the second power rail.

2. The apparatus as recited in claim 1, wherein the first voltage at which the first power rail is configured to provide the first power is nominally one half of the second voltage at which the second power rail is configured to provide the second power.

3. The apparatus as recited in claim 1, wherein:
the power distribution network further comprises a third power rail configured to provide third power at a third voltage that is different from the first voltage of the first power rail; and
the amplifier of the transceiver circuit is coupled to the third power rail.

4. The apparatus as recited in claim 3, wherein the first voltage at which the first power rail is configured to provide the first power is nominally one half of the third voltage at which the third power rail is configured to provide the third power to the amplifier.

5. The apparatus as recited in claim 1, wherein:
a resistance value of the first resistor is within a ten percent tolerance range of one half of a resistance value of the second resistor; or
the resistance value of the first resistor is within a ten percent tolerance range of one half of a resistance value of the third resistor.

6. The apparatus as recited in claim 1, wherein the transceiver circuit further comprises:
a fourth resistor having a first terminal coupled to the signal line of the interface;
a fourth switch coupled between a second terminal of the fourth resistor and the node configured to sink current;
a fifth resistor having a first terminal coupled to the signal line of the interface; and
a fifth switch coupled between a second terminal of the fifth resistor and the second power rail.

7. The apparatus as recited in claim 6, wherein:
a resistance value of the second resistor matches a resistance value of the fourth resistor within a tolerance range of ten percent; or
a resistance value of the third resistor matches a resistance value of the fifth resistor within a tolerance range of ten percent.

8. The apparatus as recited in claim 7, wherein the resistance value of the second resistor, the resistance value of the third resistor, the resistance value of the fourth resistor, and the resistance value of the fifth resistor match within a tolerance range of ten percent.

9. The apparatus as recited in claim 6 wherein the transceiver circuit further comprises:
a sixth resistor having a first terminal coupled to the signal line of the interface;
a sixth switch coupled between a second terminal of the sixth resistor and the node configured to sink current;
a seventh resistor having a first terminal coupled to the signal line of the interface; and
a seventh switch coupled between a second terminal of the seventh resistor and the node configured to sink current.

10. The apparatus as recited in claim 9, wherein:
a resistance value of the sixth resistor is less than half of a resistance value of the third resistor or a resistance value of the fifth resistor; and
a resistance value of the seventh resistor is less than half of the resistance value of the third resistor or the resistance value of the fifth resistor.

11. The apparatus as recited in claim 9, wherein:
the control logic of the apparatus comprises write path circuitry to which the output of the amplifier is coupled, and the write path circuitry including one of:
a de-serializer circuit;
an equalizer circuit; or a decision feedback equalizer circuit.

12. The apparatus as recited in claim 1, wherein the control logic is configured to enable access to the at least one memory array in accordance with a Low-Power Double Data Rate (LPDDR) specification.

13. An apparatus comprising:
an amplifier having an input and an output, the output of the amplifier coupled to a de-serializer circuit;
a signal line coupled to the input of the amplifier;
a first resistor having a first terminal coupled to the signal line;
a first switch coupled between a second terminal of the first resistor and a first power rail, the first power rail configured to provide first power at a first voltage;
a second resistor having a first terminal coupled to the signal line;
a second switch coupled between a second terminal of the second resistor and a node configured to sink current;
a third resistor having a first terminal coupled to the signal line; and
a third switch coupled between a second terminal of the third resistor and a second power rail, the second power rail configured to provide second power at a second voltage that is less than the first voltage of the first power.

14. The apparatus as recited in claim 13, wherein the first voltage at which the first power rail is configured to provide the first power is less than two thirds of the second voltage at which the second power rail is configured to provide the second power.

15. The apparatus as recited in claim 13, wherein the first voltage at which the first power rail is configured to provide the first power is nominally one half of the second voltage at which the second power rail is configured to provide the second power.

16. The apparatus as recited in claim 13, wherein the amplifier is coupled to a third power rail configured to provide third power at a third voltage that is different from the first voltage of the first power provided by the first power rail.

17. The apparatus as recited in claim 16, wherein the first voltage at which the first power rail is configured to provide the first power is nominally one half of the third voltage at which the third power rail is configured to provide the third power to the amplifier.

18. The apparatus as recited in claim 13, wherein:
a resistance value of the first resistor is within a ten percent tolerance range of one half of a resistance value of the second resistor; or
the resistance value of the first resistor is within a ten percent tolerance range of one half of a resistance value of the third resistor.

19. The apparatus as recited in claim 13, wherein:
a resistance value of the first resistor matches a resistance value of the second resistor within a tolerance range of ten percent; or
the resistance value of the first resistor matches a resistance value of the third resistor within a tolerance range of ten percent.

20. The apparatus as recited in claim 13, further comprising:
a fourth resistor having a first terminal coupled to the signal line;
a fourth switch coupled between a second terminal of the fourth resistor and the node configured to sink current;
a fifth resistor having a first terminal coupled to the signal line; and
a fifth switch coupled between a second terminal of the fifth resistor and the second power rail.

21. The apparatus as recited in claim 20, wherein:
a resistance value of the second resistor matches a resistance value of the fourth resistor within a tolerance range of ten percent; or
a resistance value of the third resistor matches a resistance value of the fifth resistor within a tolerance range of ten percent.

22. The apparatus as recited in claim 21, wherein the resistance value of the second resistor, the resistance value of the third resistor, the resistance value of the fourth resistor, and the resistance value of the fifth resistor match within a tolerance range of ten percent.

23. The apparatus as recited in claim 20, further comprising:
a sixth resistor having a first terminal coupled to the signal line;
a sixth switch coupled between a second terminal of the sixth resistor and the node configured to sink current;
a seventh resistor having a first terminal coupled to the signal line; and
a seventh switch coupled between the second terminal of the seventh resistor and the second power rail.

24. The apparatus as recited in claim 23, wherein:
a resistance value of the sixth resistor is less than half of a resistance value of the third resistor or a resistance value of the fifth resistor; or
a resistance value of the seventh resistor is less than half of the resistance value of the third resistor or the resistance value of the fifth resistor.

25. The apparatus as recited in claim 13, wherein:
the signal line comprises a bi-directional data line; and
the apparatus is configured as or part of a transceiver circuit for the bi-directional data line, the transceiver circuit comprising:
a receiver portion that includes the amplifier, the first switch, and the first resistor; and
a transmitter portion that includes the second switch, second resistor, third switch, and third resistor.

26. The apparatus as recited in claim 25, wherein the transceiver circuit is coupled with control circuitry configured to:
- activate the first switch to couple the bi-directional data line to the first power rail via the first resistor to implement a receive mode, the second switch and third switch deactivated in the receive mode; or
- activate at least one of the second switch or the third switch to couple the bi-directional data line to the node configured to sink current via the second resistor or to the second power rail via the third resistor to implement a transmit mode, the first switch deactivated in the transmit mode.

27. The apparatus as recited in claim 13, wherein:
- the output of the amplifier is coupled to the de-serializer circuit via an equalizer circuit; or
- the amplifier is implemented as part of the equalizer circuit, the equalizer circuit coupled to the de-serializer circuit.

28. The apparatus as recited in claim 27, wherein the de-serializer circuit is configured as a decision feedback equalizer circuit.

29. An apparatus comprising:
- an interface for a memory interconnect;
- control logic configured to enable communication of data through the interface;
- a power distribution network that includes a first power rail to provide first power at a first voltage and a second power rail to provide second power at a second voltage, the first voltage being less than two thirds the second voltage; and
- a transceiver circuit comprising:
  - an amplifier having an input coupled to a signal line of the interface and an output coupled to the control logic;
  - a first resistor having a first terminal coupled to the signal line;
  - a first switch coupled between a second terminal of the first resistor and the first power rail;
  - a second resistor having a first terminal coupled to the signal line;
  - a second switch coupled between a second terminal of the second resistor and a node configured to sink current;
  - a third resistor having a first terminal coupled to the signal line; and
  - a third switch coupled between a second terminal of the third resistor and the second power rail.

30. The apparatus as recited in claim 29, wherein the first voltage at which the first power rail is configured to provide the first power is nominally one half of the second voltage at which the second power rail is configured to provide the second power.

31. The apparatus as recited in claim 29, wherein:
- the power distribution network further comprises a third power rail configured to provide third power at a third voltage that is different from the first voltage of the first power rail; and
- the amplifier of the transceiver circuit is coupled to the third power rail.

32. The apparatus as recited in claim 31, wherein the first voltage at which the first power rail is configured to provide the first power is nominally one half of the third voltage at which the third power rail is configured to provide the third power to the amplifier.

33. The apparatus as recited in claim 29, wherein:
- a resistance value of the first resistor is within a ten percent tolerance range of one half of a resistance value of the second resistor; or
- the resistance value of the first resistor is within a ten percent tolerance range of one half of a resistance value of the third resistor.

34. The apparatus as recited in claim 29, wherein:
- a resistance value of the first resistor matches a resistance value of the second resistor within a tolerance range of ten percent; or
- the resistance value of the first resistor matches a resistance value of the third resistor within a tolerance range of ten percent.

35. The apparatus as recited in claim 29, wherein:
- the control logic of the apparatus comprises read path circuitry to which the output of the amplifier is coupled, and the read path circuitry comprises one of:
  - a de-serializer circuit;
  - an equalizer circuit; or
  - a decision feedback equalizer circuit.

36. The apparatus as recited in claim 29, wherein the control logic of the apparatus is configured to enable the communication of the data through the interface in accordance with a Low-Power Double Data Rate (LPDDR) specification.

37. A method comprising:
- receiving an indication to operate a memory circuit in a receive mode, the memory circuit coupled to a memory interconnect;
- disabling a pull-down resistor coupled between a signal line of the memory interconnect and a node configured to sink current;
- disabling a first pull-up resistor coupled between the signal line of the memory interconnect and a first power rail configured to provide first power at a first voltage;
- enabling a second pull-up resistor coupled between the signal line and a second power rail configured to provide second power at a second voltage that is nominally half of the first voltage; and
- receiving, by an amplifier of the memory circuit, signals via the signal line of the memory interconnect that is coupled to the second power rail by the second pull-up resistor.

38. The method as recited in claim 37, wherein the amplifier of the memory circuit is coupled to a third power rail configured to provide third power at a third voltage that is nominally twice the second voltage of the second power rail.

39. The method as recited in claim 37, further comprising:
- amplifying the signals received via the signal line using the amplifier to provide amplified signals; and
- providing, from the amplifier, the amplified signals to an equalizer or de-serializer of the memory circuit.

40. The method as recited in claim 37, wherein:
- a resistance value of the pull-down resistor is nominally twice a resistance value of the second pull-up resistor; or
- a resistance value of the first pull-up resistor is nominally twice the resistance value of the second pull-up resistor.

41. The method as recited in claim 37, wherein:
- a resistance value of the pull-down resistor matches a resistance value of the second pull-up resistor within a tolerance range of ten percent; or
- a resistance value of the first pull-up resistor matches the resistance value of the second pull-up resistor within a tolerance range of ten percent.

42. The method as recited in claim 37, wherein:
the memory circuit is implemented in a memory device that is configured to operate in accordance with a Low-Power Double Data Rate (LPDDR) specification.

43. The method as recited in claim 37, wherein:
the memory circuit is implemented in a memory controller integrated-circuit that is configured to operate in accordance with an LPDDR specification.

\* \* \* \* \*